United States Patent [19]
Ogawa et al.

[11] Patent Number: 5,835,045
[45] Date of Patent: Nov. 10, 1998

[54] SEMICONDUCTOR DEVICE, AND OPERATING DEVICE, SIGNAL CONVERTER, AND SIGNAL PROCESSING SYSTEM USING THE SEMICONDUCTOR DEVICE.

[75] Inventors: Katsuhisa Ogawa, Sendai; Mamoru Miyawaki, Isehara; Hayao Ohzu, Fuchu; Yukihiko Sakashita, Hadano; Tetsunobu Kochi, Hiratsuka; Akihiro Ouchi, Isehara, all of Japan

[73] Assignee: Canon Kabushiki Kaisha, Tokyo, Japan

[21] Appl. No.: 548,607

[22] Filed: Oct. 26, 1995

[30] Foreign Application Priority Data

Oct. 28, 1994 [JP] Japan .................................. 6-265042
Jan. 31, 1995 [JP] Japan .................................. 7-014097

[51] Int. Cl.$^6$ ...................................................... H03M 1/12
[52] U.S. Cl. .......................... 341/155; 341/141; 341/159; 327/91; 327/407
[58] Field of Search ...................................... 341/155, 156, 341/158, 159, 141; 327/407–410, 419, 416, 94, 91

[56] References Cited

U.S. PATENT DOCUMENTS

| | | | |
|---|---|---|---|
| 4,760,346 | 7/1988 | Kultgen et al. ........................ | 307/243 |
| 5,010,338 | 4/1991 | Miki et al. ............................. | 341/159 |
| 5,329,172 | 7/1994 | Kohdaka ................................ | 307/355 |
| 5,341,050 | 8/1994 | Mellissinos ........................... | 307/490 |
| 5,420,806 | 5/1995 | Shou et al. ............................. | 364/606 |
| 5,428,237 | 6/1995 | Yuzurihara ............................. | 257/349 |
| 5,461,381 | 10/1995 | Seaberg ................................. | 341/143 |
| 5,466,961 | 11/1995 | Kikuchi et al. ........................ | 257/379 |

FOREIGN PATENT DOCUMENTS

| | | |
|---|---|---|
| 0569856 | 11/1993 | European Pat. Off. . |
| 2536922 | 6/1984 | France . |
| 2599526 | 12/1987 | France . |
| 4402952 | 6/1994 | Germany . |

OTHER PUBLICATIONS

"An Economical Majority Logic IC Materialized by the CMOS", Nikkei Electronics, Nov. 5, 1973, pp. 132–144.

Patent Abstracts of Japan, vol. 013, No. 309, (P–898), Jul. 14, 1989 & JP 01 081082 A (Fuji Photo Film Co. Ltd.), Mar. 27, 1989.

Primary Examiner—Marc S. Hoff
Assistant Examiner—Jason L. W. Kost
Attorney, Agent, or Firm—Fitzpatrick, Cella, Harper & Scinto

[57] ABSTRACT

A reduction in circuit size, an increase in operation speed, and a reduction in power consumption can be attained by a semiconductor device, in which capacitors are connected to multiple input terminals through switch, one terminal of each capacitance is commonly connected, and the common connection terminal is connected to a sense amplifier, including a reset at a floating point which is the contact between the common connection terminal of the capacitors and the input of the sense amplifier. In addition, an increase in yield can be realized by reducing the manufacturing cost.

34 Claims, 22 Drawing Sheets

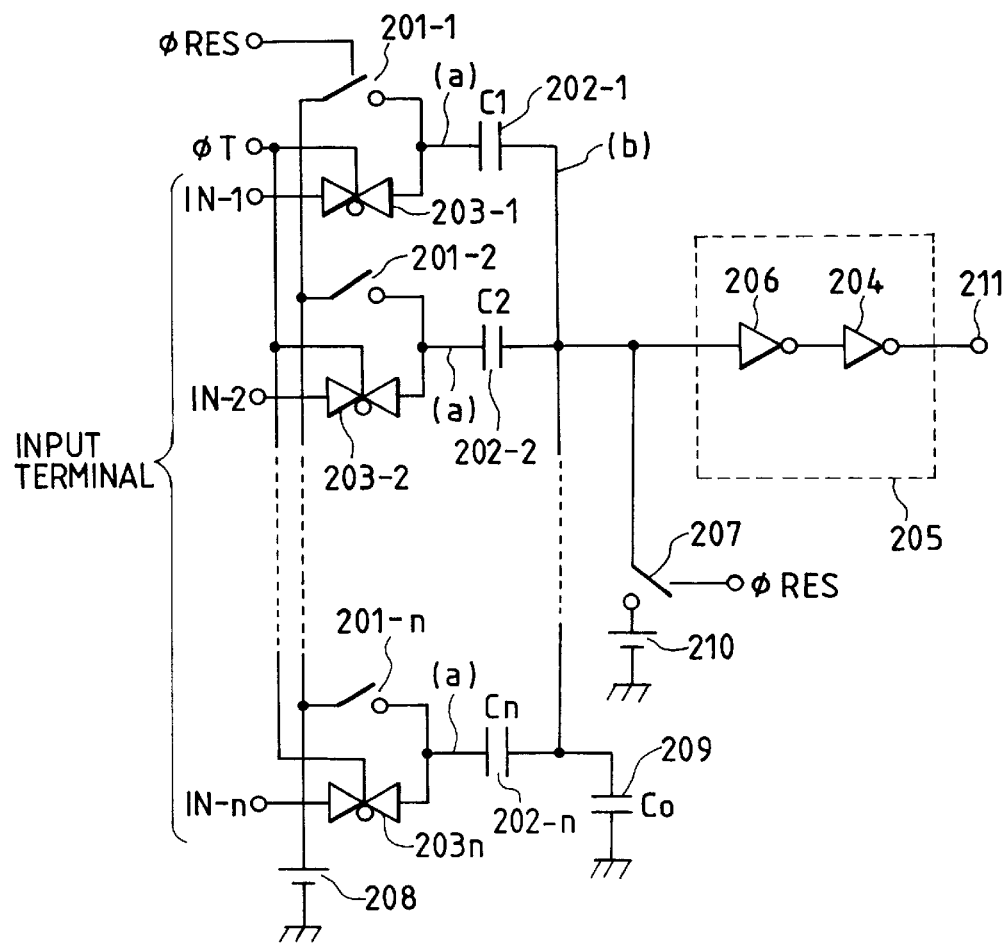
FIG. 4
FIG. 5A φRES
FIG. 5B φT
FIG. 5C OUT

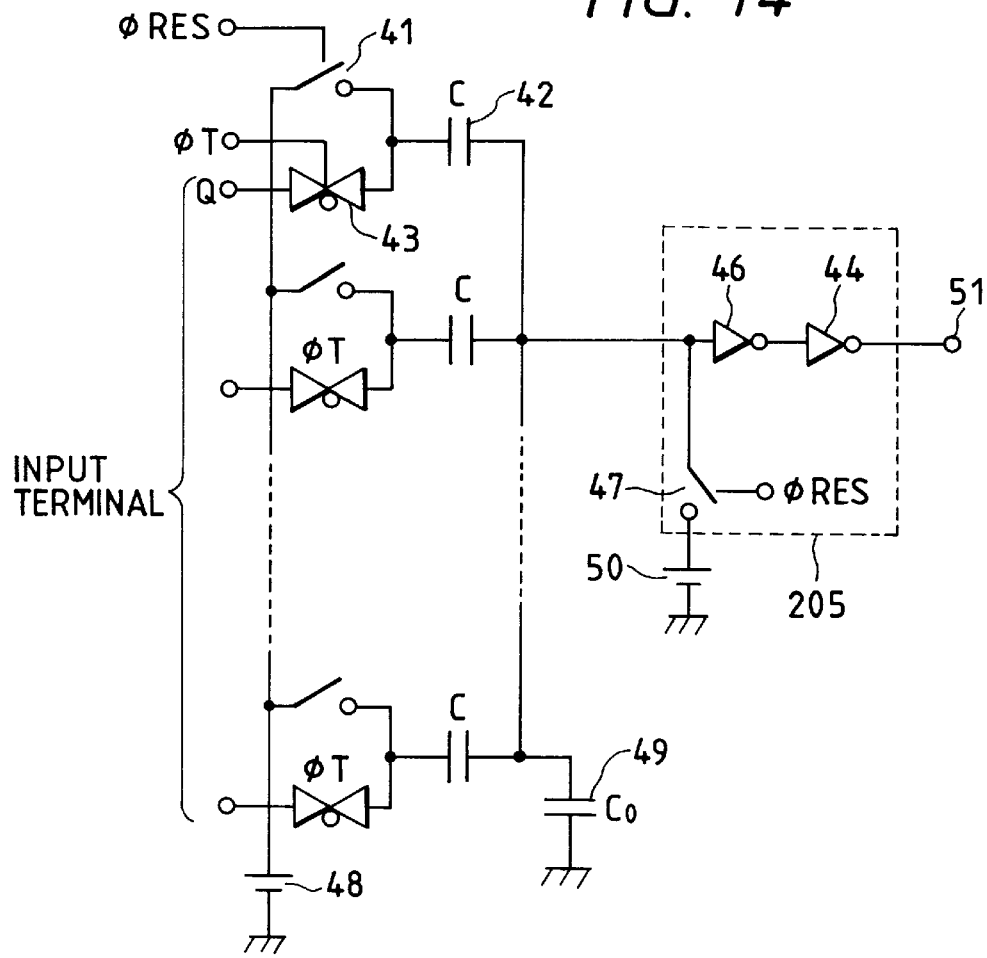
FIG. 14
FIG. 15A φRES
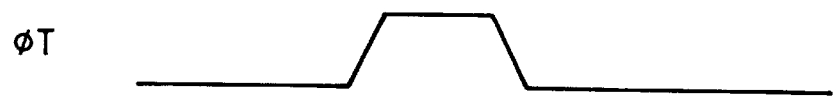
FIG. 15B φT
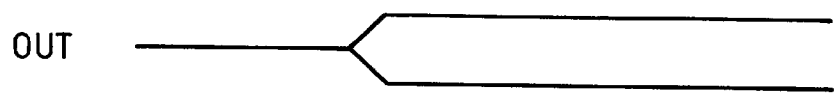
FIG. 15C OUT

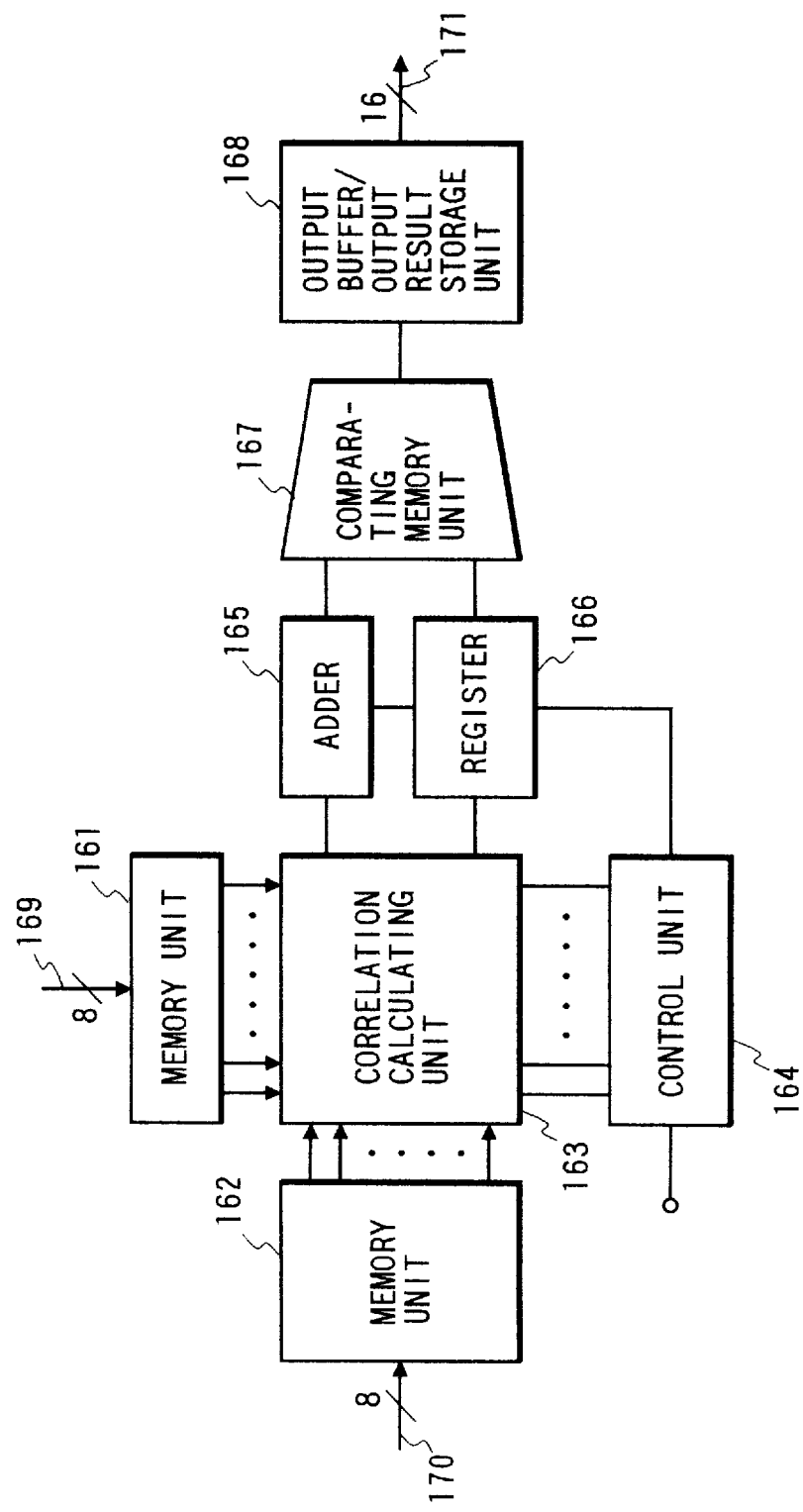

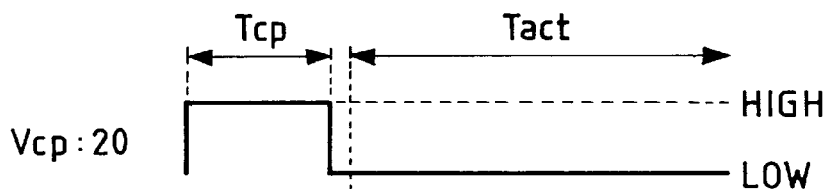
FIG. 21A  Vcp:20
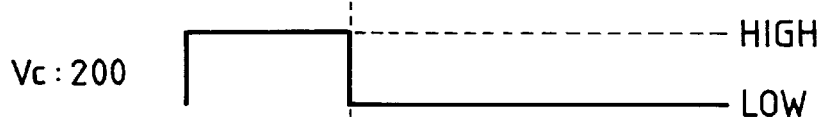
FIG. 21B  Vc:200
FIG. 21C  Vfg:10
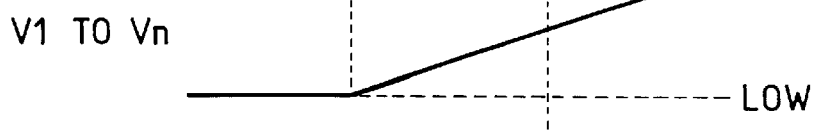
FIG. 21D  V1 TO Vn
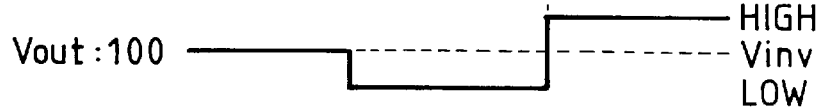
FIG. 21E  Vout:100
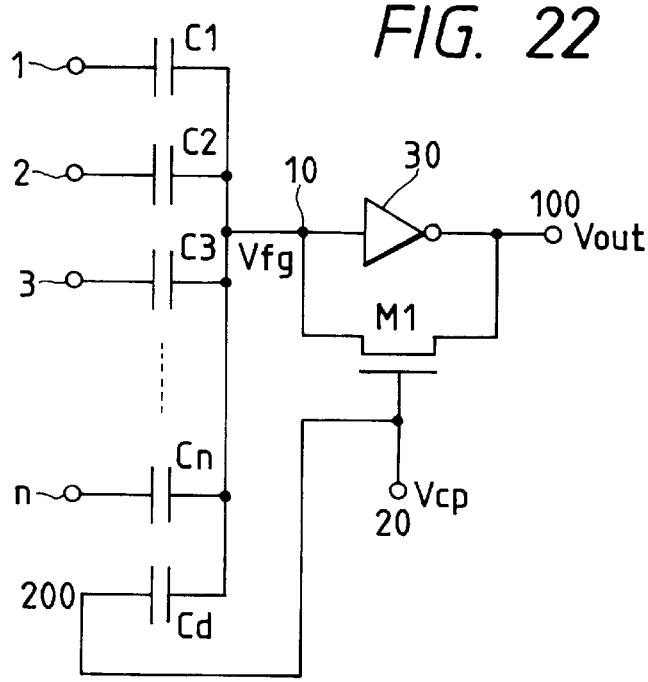
FIG. 22

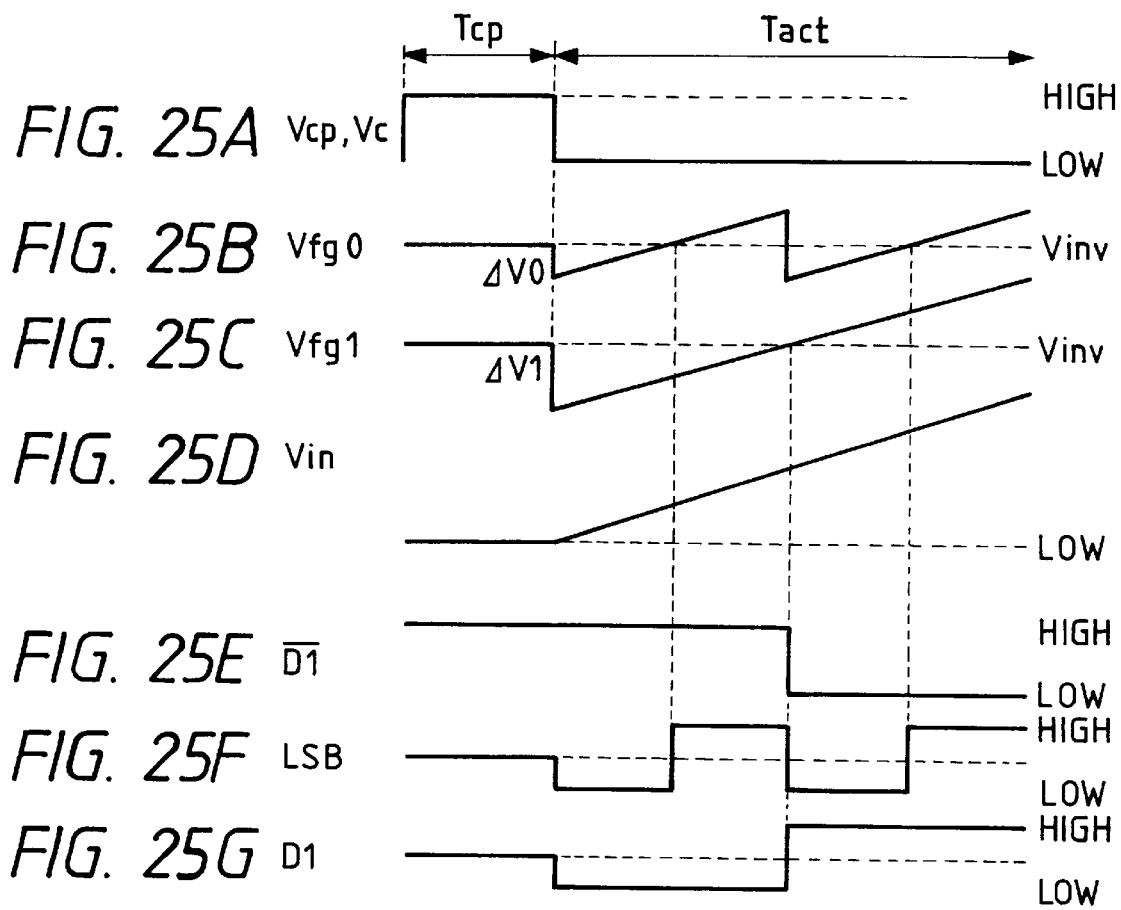

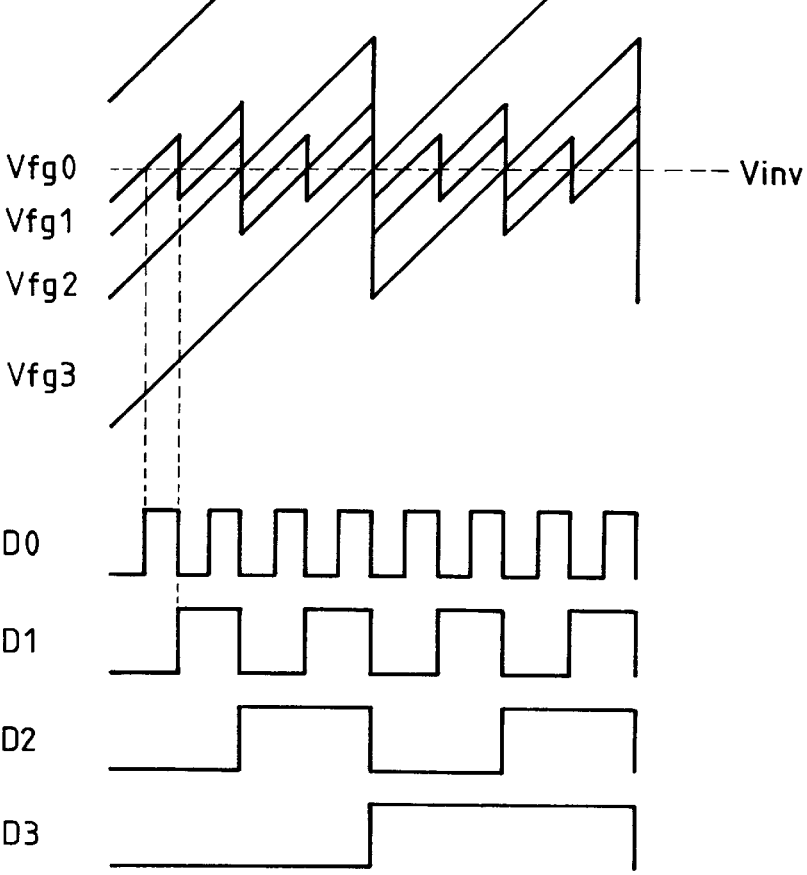
FIG. 26A  Vin
FIG. 26B  Vfg0
FIG. 26C  Vfg1
FIG. 26D  Vfg2
FIG. 26E  Vfg3
FIG. 26F  D0
FIG. 26G  D1
FIG. 26H  D2
FIG. 26I  D3

SEMICONDUCTOR DEVICE, AND OPERATING DEVICE, SIGNAL CONVERTER, AND SIGNAL PROCESSING SYSTEM USING THE SEMICONDUCTOR DEVICE.

BACKGROUND OF THE INVENTION

1. Field of the Invention

The present invention relates to a semiconductor device, and an operating device, a signal converter, and a signal processing system using the semiconductor device, and, more particularly, to a semiconductor device which can perform parallel arithmetic operations, and an operating device which can perform, e.g., correlation calculation, a signal converter for performing A/D (analog-to-digital) or D/A (digital-to-analog) conversion of a signal, and a signal processing system using the semiconductor device.

2. Related Background Art

In recent years, upon improvement in signal processing, it has become important to realize Low-cost operating devices which can process a very large volume of data at high speed.

In particular, techniques for a correlation calculating device which can be used in motion detection of dynamic images, a high-precision analog-to-digital (A/D) converter, a spread spectrum (SS) communication, and the like require signal processing at speeds on the order of GHz.

Conventionally, when such a function is realized by a semiconductor integrated circuit, parallel arithmetic operations are attained using a plurality of semiconductor chips so as to attain high-speed processing, or circuits are integrated on a quite large chip using the latest micro-layout rule.

For example, in the case of an image pickup system shown in FIG. 1, time-series analog signals output from a sensing unit 160, in which image pickup elements 141 are arranged two-dimensionally, and which serves as an area sensor, are converted into digital signals by an A/D converter 140, and are temporarily stored in a frame memory 139. These signals are processed by an arithmetic operation circuit 138, and the processed signals are output from an arithmetic operation output circuit 150. More specifically, by executing a correlation arithmetic operation between data obtained at different times, the moving amount ($\Delta X$, $\Delta Y$) of an object or the like can be output.

However, in order to perform real-time processing of a dynamic image, the number of processing steps in the arithmetic operation processing is very large, and in order to obtain images with higher reality, the circuit scale increases in progression, resulting in a low processing speed. For example, a demand has arisen for an apparatus which can process an MPEG2 method proposed as a dynamic image expansion/compression method at a practical speed.

As the problems of the above-mentioned parallel arithmetic operation processing, the problem of a decrease in operation speed and the problem of an increase in consumption of power upon an increase in circuit scale are posed. Also, the problem of an increase in manufacturing cost and the problem of a decrease in manufacturing yield upon an increase in circuit scale are posed.

Furthermore, a majority logic circuit effective for the arithmetic operation processing circuit is disclosed in Nikkei Electronics "Economical Majority Logic IC Realized by CMOS", Nov. 5, 1973, pp. 132–144, as one of digital signal processing methods. This reference describes a circuit based on a CMOS technique. In this case as well, since the number of elements based on the CMOS technique increases, and the number of stages in the arithmetic operation processing increases, the problems of an increase in circuit scale, an increase in consumption of power, and a decrease in operation speed are similarly posed.

In a conventional semiconductor device that performs parallel arithmetic operation processing, since the circuit scale increases in progression as the number of signals to be subjected to parallel arithmetic operations increases, the manufacturing cost increases, and the yield is lowered. Due to an increase in delay amount of, e.g., wiring lines or due to an increase in the number of times of arithmetic operations in the circuit upon an increase in circuit scale, the operation speed decreases. Furthermore, the consumption of power increases considerably.

In particular, in an arithmetic operation circuit having multiple input terminals, in performing parallel arithmetic operations, errors are caused in operation results due to offsets. For this reason, accurate arithmetic operations cannot be performed.

SUMMARY OF THE INVENTION

The present invention has been made in consideration of the above problems, and has as its object to provide a semiconductor device which has high reliability, can remove the noise component of a signal, and can perform an accurate operation.

It is another object of the present invention to provide a semiconductor device which can be constituted by a small number of elements such as transistors, and can improve sensitivity with respect to small signals.

It is still another object of the present invention to provide a semiconductor device which can realize a reduction in circuit size, an increase in operation speed, and a reduction in power consumption, thereby attaining a reduction in manufacturing cost and an increase in yield.

It is still another object of the present invention to provide a semiconductor device which can obtain an accurate calculation result without decreasing the operation speed.

It is still another object of the present invention to provide a semiconductor device which can perform high-precision detection and comparison/determination of potential changes.

It is still another object of the present invention to provide a semiconductor device including a plurality of input terminals, a plurality of capacitors each having one terminal electrically connected to a corresponding one of the input terminals through a switch, a sense amplifier commonly connected to the other terminal of each of the capacitors, and a reset element connected to the common connection line of the capacitors.

It is still another object of the present invention to provide a semiconductor device including a plurality of input terminals, and a comparison/determination unit commonly connected to the respective input terminals through capacitors, wherein the input and output portions of the comparison/determination unit can be electrically connected through a switch.

It is still another object of the present invention to provide a semiconductor device in which in executing comparison/determination processing by detecting low voltages, an inverter amplifier is inverted only when a potential change exceeding an arbitrary potential level occurs after the potential of the input terminal of the inverter is reset to an intermediate level.

It is still another object of the present invention to provide an operating device, a signal Converter, and a signal processing system, all of which utilize the semiconductor device which achieves the above objects.

It is still another object of the present invention to provide a semiconductor device driving method which can achieve the above objects.

It is still another object of the present invention to provide a method of driving a semiconductor device in which a plurality of input terminals are commonly connected through capacitor, an input portion of a comparison/determination unit is connected to the common connection portion, and switch is arranged between output and input portions of the comparison/determination unit, comprising the steps of:

turning on the switch to set the input and output portions of the comparison/determination to the same potential;

turning off the switch to set the input portion of the comparison/determination unit in a floating state;

applying a voltage through at least one input terminal of the plurality of input terminals;

shifting a potential of the input portion of the comparison/determination unit, which is set in the floating state, from an intermediate level to a desired level; and applying voltages through the remaining input terminals to cause the comparison/determination unit to perform an inverting operation.

BRIEF DESCRIPTION OF THE DRAWINGS

FIGS. 2, 4, 6, 7, 8, 9, 11, 13, 14, 20, 22, 23, and 24 are schematic equivalent circuit diagrams for explaining the semiconductor devices of the present invention, respectively;

FIGS. 3A to 3C, 5A to 5C, 10A to 10J, 15A to 15C, 21A to 21E, 25A to 25G, and 26A to 26I are schematic timing charts for explaining the operation timings in the present invention, respectively;

FIG. 17 is a schematic block diagram for explaining the overall arrangement of a semiconductor device using the present invention;

DETAILED DESCRIPTION OF THE PREFERRED EMBODIMENTS

Figure 1:
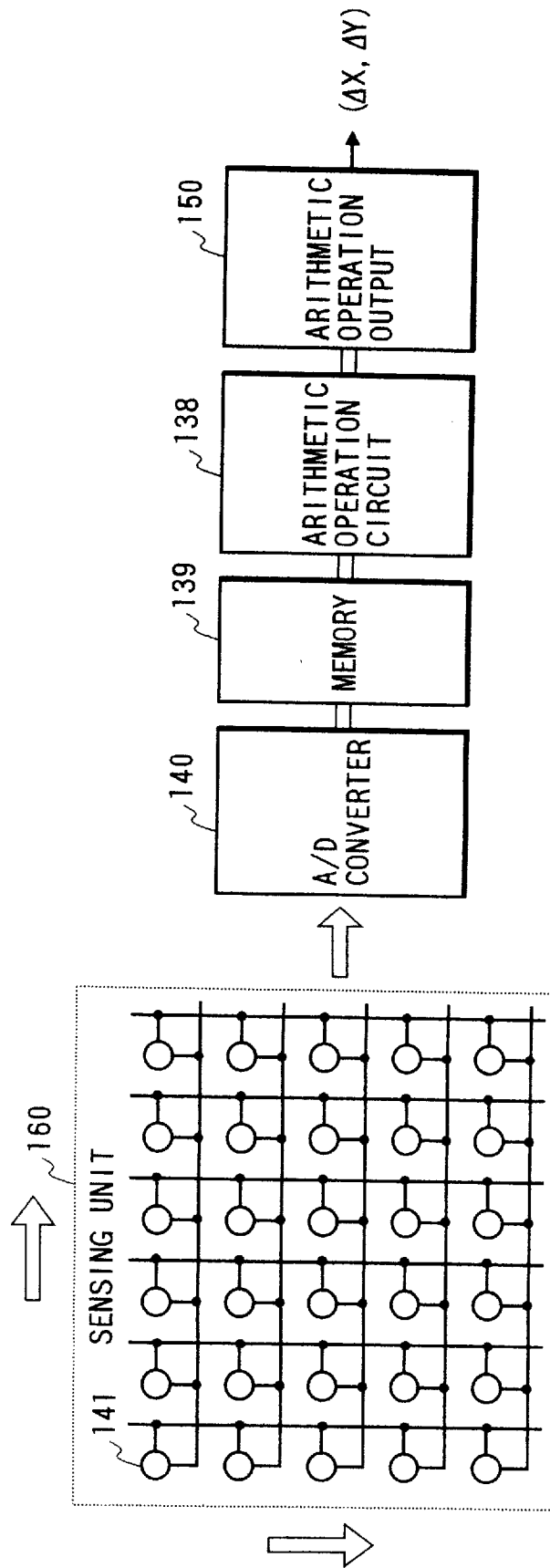
FIG. 1 is a schematic block diagram for explaining the arrangement of an image pickup device.

The above problems can be solved by a semiconductor device or a means using this semiconductor device, which includes a plurality of input terminals, a plurality of capacitors each having one terminal electrically connected to a corresponding one of the input terminals through a switch, a sense amplifier commonly connected to the other terminal of each of the capacitors, and a reset element connected to the common connection line of the capacitors.

That is, with this arrangement, majority bit signals supplied from multiple input terminals can be realized with high precision and with a small circuit size.

By connecting the reset element to both terminals of each of the capacitors, a high-speed, high-precision circuit can be realized. If the above sense amplifier is constituted by a chopper inverter, and the amplifier has a function of turning off the chopper inverter while the inverter is not being used, a low-power-consumption sense amplifier which is resistant to process variations such as variations in threshold voltage $V_{th}$ can be realized. If the sense amplifier is constituted by a latch type positive feedback amplifier, and the amplifier has a switch for connecting the input and output of the amplifier, a sense amplifier with a high reset speed, a high gain, a high output speed, and low power consumption can be realized.

In addition, a differential amplifier is used as a sense amplifier, and the amplifier has an operation ON/OFF function. The output and input terminals of the amplifier are short-circuited to obtain a negative feedback effect. An auxiliary capacitor is charged/discharged to set the offset at the output to be 0, and the input terminal is controlled to cancel the $V_{th}$ offset. With this arrangement, a high-precision arithmetic operation is realized. Furthermore, a high-sensitivity, high-speed operation can be realized by increasing the number of input terminals.

In the above semiconductor device, an inverter constituting the sense amplifier may have an arrangement in which the source and drain of a first NMOS transistor are respectively connected to GND (ground) and the drain of a first PMOS transistor, the source of the first PMOS transistor is connected to the highest potential, the gate of the first NMOS transistor is connected to the gate of the first PMOS transistor to form the input of the inverter, and the drain contact between the first NMOS transistor and the first PMOS transistor serves as the output of the inverter.

In the semiconductor device, an inverter constituting the sense amplifier may be a switched inverter, and a second inverter may be arranged on the output side of the switched inverter so as to turn off the switched inverter after an output signal is transferred from the switched inverter to the second inverter.

In the semiconductor device, the sense amplifier may have a latch type positive feedback amplifier. In this case, the latch type positive feedback amplifier preferably has an arrangement in which first and second NMOS transistors have a common source, the gates of the transistors are respectively connected to the drains of the transistors on the opposite sides, first and second PMOS transistors have a common source, the gates of the transistors are respectively connected to the drains of the transistors on the opposite sides, the contact between the drain of the first NMOS transistor and the gate of the second NMOS transistor is connected to the contact between the drain of the first PMOS transistor and the gate of the second PMOS transistor to form the input portion of the latch type positive feedback amplifier, and the contact between the drain of the second NMOS transistor and the gate of the first NMOS transistor is connected to the contact between the drain of the second PMOS transistor and the gate of the first PMOS transistor to form the output portion of the latch type positive feedback amplifier. In addition, the latch type positive feedback amplifier preferably has a first switch between the common source of the first and second NMOS transistors and the lowest potential, and a second switch between the common source of the first and second PMOS transistors and the highest potential.

In the above semiconductor device, when the latch type positive feedback amplifier is to be shifted from an OFF state to an ON state, it is preferable that the first switch be turned on after an input signal is transferred to an input terminal, and the second switch be turned on with a slight delay.

The above semiconductor device may have a switch for connecting the output and a input of the latch type positive feedback amplifier.

The above semiconductor device may have a switch between the input of the latch type positive feedback amplifier and the common connection portion of the capacitors, and reset element respectively connected to the input and output portions of the positive feedback amplifier and the common connection portion of the capacitors.

In addition, in the above semiconductor device, a differential amplifier may be used as the sense amplifier.

In the above semiconductor device, the differential amplifier preferably has an arrangement in which first and second NMOS transistor constitute a differential pair having a common source, a current source is arranged between the common source and the lowest potential, the gate and drain of the first NMOS transistor are respectively connected to a positive input terminal and the drain and source of a first PMOS transistor, the gate and drain of the second NMOS transistor are respectively connected to a negative input terminal and the drain of a second PMOS transistor, the contact between the gate and drain of the first PMOS transistor is connected to the gate of the second PMOS transistor, the sources of the first and second PMOS transistors are connected to the highest potential, thereby constituting a current mirror type active load. The differential amplifier preferably transferring a signal to the next stage by using the positive input terminal, which is the gate of the first NMOS transistor, as a signal input terminal, and the contact between the drain of the second NMOS transistor and the second PMOS transistor as an output terminal.

In the above semiconductor device, the current source can be preferably turned on and off.

The above semiconductor device may have an auxiliary capacitance connected to the gate of the second NMOS transistor, and a switch for connecting the gate and drain of the second NMOS transistor.

In a semiconductor circuit including a plurality of semiconductor devices each identical to the above semiconductor device, an output from the first semiconductor device of the plurality of semiconductor devices and/or an inverted output from the first semiconductor device is input to the second semiconductor device.

In the above semiconductor device, when the minimum capacitance of the capacitors corresponding to the multiple input terminals is represented by C, the total capacitor value of the commonly connected capacitors is preferably set to be an odd multiple or almost an odd multiple of the minimum capacitor C.

In addition, according to the present invention, a semiconductor device preferably includes a plurality of input terminals, and a comparison/determination unit commonly connected to the input terminals through capacitors, wherein the input and output portions of the comparison/determination unit can be electrically connected through a switch.

With this arrangement, since the response precision with respect to small currents can be improved, processing with higher precision can be performed. In addition, an increase in precision can be attained with a simple arrangement and a small number of elements.

The above semiconductor device can be applied to an operating device capable of performing correlation calculation.

The above semiconductor device can be applied to a signal converter for inputting analog signals to the multiple input terminals of the semiconductor device and outputting a digital signal corresponding to the analog signals (A/D conversion) or inputting digital signals to the multiple input terminals of the semiconductor device and outputting a digital signal corresponding to the analog signals (D/A conversion).

The present invention can also be applied to a signal processing system including either the operating device or the signal converter.

The above signal processing system may include an image input device for inputting an image signal. In this case, the chip size can be reduced, and many arithmetic operations and many types of operations including many steps can be reliably and stably performed.

The above signal processing system may include a memory for storing information. In this case, in performing signal processing by the above semiconductor device having multiple input terminals, in particular, a reduction in circuit size and an increase in processing speed can be attained.

In a method of driving a semiconductor device in which a plurality of input terminals are commonly connected through capacitance, the input terminal of a comparison/determination unit is connected to the common connection terminal, and a switch is arranged between the output and input terminals of the comparison/determination unit, the following steps are preferably performed. The switch is turned on to set the input and output terminals of the comparison/determination to the same potential. The switch is then turned off to set the input terminal of the comparison/determination unit in a floating state. A voltage is applied through at least one input terminal of the plurality of input terminals. The potential of the input terminal of the comparison/determination unit, which is set in the floating state, is shifted from an intermediate level to a desired level. Voltages are applied through the remaining input terminals to cause the comparison/determination unit to perform an inverting operation.

With this driving operation, the potential of the input terminal of the comparison/determination unit is shifted from the intermediate level by an arbitrary potential amount in advance, so that the amount of voltage to be applied through the remaining input terminals to cause said comparison/determination unit to perform an inverting operation can be arbitrarily and easily changed with a small number of elements.

In the present invention, the comparison/determination unit may cause inversion at first because of the influence of the potential amount by which the potential of the input terminal is shifted in advance. Even if such inversion is caused, the effects of the present invention are not lost. That is, the effects of the present invention can be obtained if the comparison/determination unit causes inversion again upon application of certain voltages through the remaining input terminals.

In addition, the shift amount by which the potential of the input terminal is shifted in advance can be arbitrarily set in accordance with the ratios between the capacitance values of the plurality of capacitor. This setting operation can therefore be easily performed without requiring any special control based on external signals.

Embodiments of the present invention will be described in detail below with reference to the accompanying drawings.

[First Embodiment]

Figure 2:
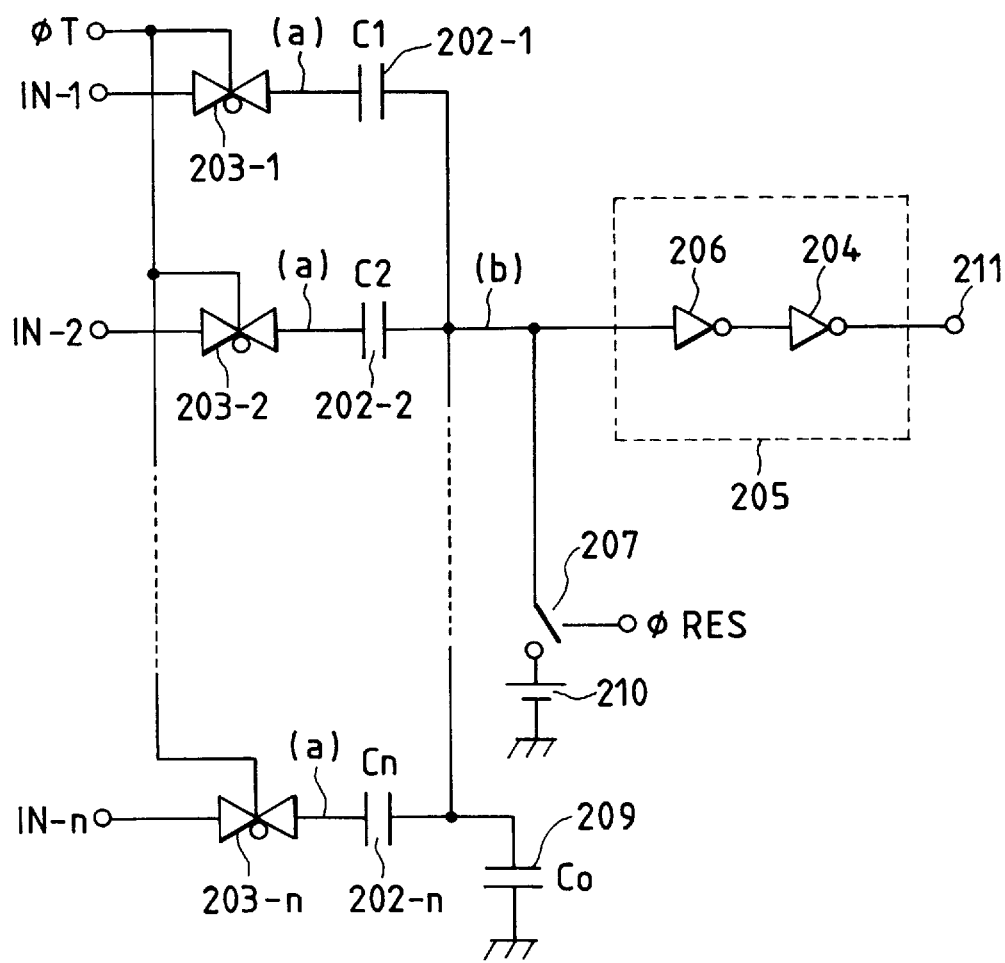

The first embodiment of the present invention will be described with reference to the multiple input logic circuit block shown in FIG. 2. Referring to FIG. 2, this circuit includes n input terminals IN-1, IN-2, . . . , IN-n, n input operation capacitors 202-1, 202-2, . . . , 202-n, switches 203-1, 203-2, . . . , 203-n for connecting/disconnecting the input terminals IN-1 to IN-n to/from the input operation capacitors 202-1 to 202-n, a sense amplifier 205, a first inverter 206 in the sense amplifier 205, a second inverter 204 in the sense amplifier 205, an output 211 of the sense amplifier 205, a reset switch 207 for resetting point (b) serving both as the input of the sense amplifier 205 and the common connection terminal of the input operation capacitors 202-1 to 202-n to a reset potential 210, and parasitic capacitances 209 parasiting at point (b), such as a parasitic capacitance at the common connection terminal of the input operation capacitors or an input capacitance in the sense amplifier.

Figure 3:
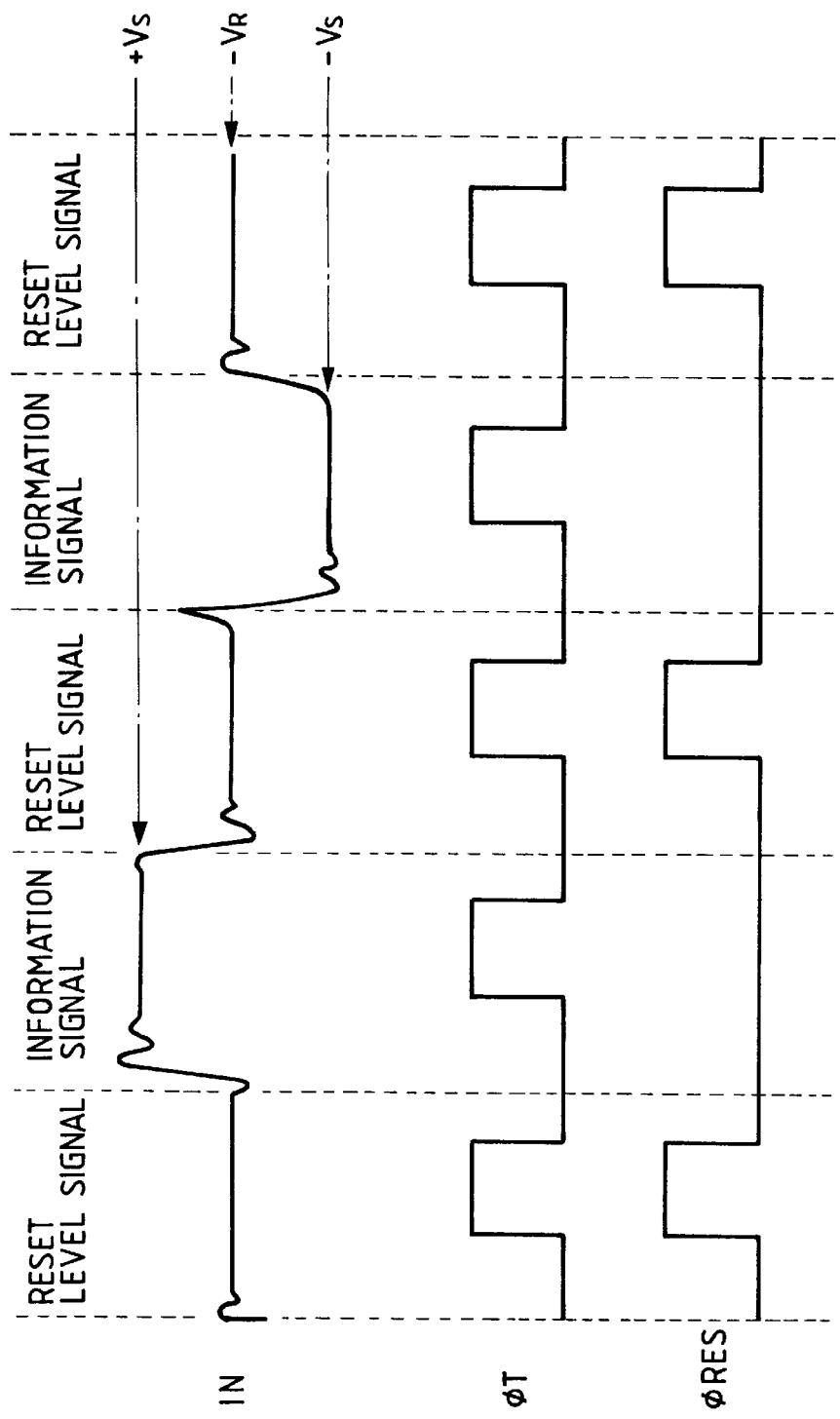

FIGS. 3A to 3C are timing charts showing the operation of the multiple input logic circuit block of this embodiment. A reset voltage $V_R$ for setting the input terminals of the input operation capacitors 202-1 to 202-n and an input information signal $\pm V_S$ are time-divisionally input to the input terminals IN-1 to IN-n. When the input signal is at reset level, a transfer pulse $\phi_T$ is turned on to reset points (a) as the input terminals of the input operation capacitors 202-1 to 202-n to the reset voltage $V_R$. If, for example, the power supply voltage is a 5-V system, about half of the power supply voltage, i.e., about 2.5 V, is used as the reset voltage $V_R$. The reset voltage $V_R$ is not limited to this voltage, and a different voltage may be used.

At almost the same time, point (b) serving both as the input terminal of the inverter 206 in the sense amplifier 205 and the common connection terminal of the input operation capacitors 202-1 to 202-n is reset to the DC value determined by the reset power supply 210 by turning on the reset switch 207 using a reset pulse $\phi_{RES}$. The value of the reset power supply 210 is set to be a value near a logic inversion voltage at which the output of the inverter 206 is inverted. In this manner, point (b) is reset.

Subsequently, the reset pulse $\phi_{RES}$ and the transfer pulse $\phi_T$ are disabled in this state. Before the input signal changes from the reset voltage $V_R$ to the information signal $V_S$, the transfer pulse $\phi_T$ is disabled, and the input terminals of the input capacitors 202-1 to 202-n are stably reset. Each input terminal is therefore set in a floating state at the reset voltage $V_R$. Point (b) is set in a floating state at almost the same time or with the start of an OFF time being slightly delayed. The input potential of point (b), i.e., the inverter 206, is stably set to a value near the logic inversion voltage set by the reset power supply 210 for the following reason. A fluctuation of the reset switch, which is caused when the transfer pulse $\phi_T$ changes from an ON state to an OFF state, slightly delays the timing of the reset pulse $\phi_{RES}$. This keeps the input of the inverter 206 at a low impedance.

After the reset pulse $\phi_{RES}$ is disabled in this manner, the input signal changes from the reset voltage $V_R$ to the information signal $V_S$. At the point of this change, overshoot or undershoot, switching noise, and the like occur upon switching operation or the like. For this reason, the above switch are turned on/off in ranges other than these noise ranges. The input signal is changed from the reset level $V_R$ to the information signal $V_S$, and the transfer pulse $\phi_T$ is enabled again to transfer the signal to the input operation capacitors 202-1 to 202-n at a position beyond the above noise interval.

Assume that each of the n input operation capacitors 202-1 to 202-n has a capacitance value Ci, and the parasitic capacitance has a capacitance value Co. In this case, when the voltage of one input terminal changes, the potential of one terminal of common connection portion (b), i.e., the inverter 206, changes with respect to the reset voltage owing to capacitance division by $$(Ci \times V)/(Co+nCi)[V] \tag{1}$$

where V is the voltage change of the input voltage. If, for example, the potential of input terminal side (a) is reset to 2.5 V, the above potential changes from the reset voltage to 0 V corresponding to Low level or 5 V corresponding to High level.

That is, when a change of ±2.5 V from the reset voltage is input as an input signal to one input terminal, the reset voltage of the input terminal of the inverter 206 changes by $$\pm[(2.5 \times Ci)/(Co+nCi)][V] \tag{2}$$

When the input voltage of the inverter 206 changes from the reset voltage, i.e., the value near the logic inversion amplitude, the output voltage of the inverter 206 is inverted. When signals are respectively input to the N inputs, the sum of N capacitance division outputs is input to the input terminal of the inverter 206. As a result, a High- or Low-level signal appears at the output terminal 211 of the sense amplifier 205 in accordance with a potential change input to input terminal side (a) of each capacitance.

With the above arrangement, a multiple input logic circuit can be realized, in which even if a reset signal and an information signal are input through a common terminal, noise caused when a signal changes is cut by the switch connected to each input terminal, thereby allowing an accurate arithmetic operation. In addition, this circuit can perform parallel arithmetic operations with a smaller number of transistors than in a general binary logic circuit. Reductions in chip size and power consumption can therefore be realized.

[Second Embodiment]

FIG. 4 shows the second embodiment of the present invention. FIG. 4 is a circuit diagram showing a multiple input logic circuit block. Referring to FIG. 4, this circuit includes reset switches 201-1 to 201-n which operate at the same timing corresponding to n inputs, input operation capacitors 202-1 to 202-n corresponding to the n inputs, signal transfer switches 203-1 to 203-n which operate at the same timing corresponding to the n inputs, a sense amplifier 205, a first inverter 206 in the sense amplifier 205, a second inverter 204 in the sense amplifier 205, a reset power supply 208 for resetting the input operation capacitors 202-1 to 202-n through the reset switches 201-1 to 201-n, an output terminal 211 of the sense amplifier 205, a parasitic capacitance 209 including input capacitances in the input operation capacitors 202-1 to 202-n and the sense amplifier 205, a second reset switch 207, and a reset power supply 210 for resetting the input terminal portion of the first inverter 206.

Referring to FIG. 4, this circuit includes a total of n input terminals IN-1, IN-2, . . . , IN-n. The capacitance values of the input operation capacitors 202-1 to 202-n may be the same or different.

FIGS. 5A to 5C are timing charts showing the operation of the circuit of this embodiment. The operation of the embodiment will be described with reference to FIGS. 5A to 5C. First of all, input terminal (a) of each of the input operation capacitors 202-1 to 202-n is reset to the DC potential determined by the reset power supply 208 by using a reset pulse $\phi_{RES}$. If, for example, the power supply voltage is a 5-V system, about half of the power supply voltage, i.e., about 2.5 V, is used as the reset voltage $V_R$. The reset voltage $V_R$ is not limited to this voltage, and a different voltage may be used.

At almost the same time, the second reset switch 207 is turned on to reset the input terminal of the inverter 206 in the sense amplifier 205 to the voltage value determined by the second reset power supply 210. The value of the second reset power supply 210 is set to be a value near a logic inversion voltage at which the output of the inverter 206 is inverted. In this manner, common connection portion (b) of the input operation capacitors. In this state, the reset pulse $\phi_{RES}$ is turned off. In this case, when the reset switch 207 is turned off at the same time as the OFF timing of the reset switches 201-1 to 202-n or with a slight delay, common connection portion (b), i.e., the input terminal of the inverter 206, is set to be a value near the logic inversion amplitude set by the second reset power supply 210. This is because a voltage fluctuation caused by the reset switch is kept at a low impedance for a short period of time.

Subsequently, when a transfer pulse $\phi_T$ is set at High level, the transfer switches 201-1 to 201-n are turned on. As a result, input signals to the input terminals IN-1 to IN-n are respectively transferred to the input operation capacitors 202-1 to 202-n.

Assume that each of the n input operation capacitors 202-1 to 202-n has a capacitance value Ci, and the parasitic capacitance has a capacitance value Co. In this case, when the voltage of one input terminal of the common connection portion (b) changes, the potential of one terminal of common connection portion (b), i.e., the inverter 206, changes with respect to the reset voltage owing to capacitance division by $$(Ci \times V)/(Co+nCi)[V] \quad (3)$$

where V is the voltage change of the input voltage. If, for example, the potential of input terminal side (a) is reset to 2.5 V, the above potential changes from the reset voltage to 0 V corresponding to Low level or 5 V corresponding to High level. That is, when a change of ±2.5 V from the reset voltage is input, the potential changes from the second reset voltage of the input terminal of the inverter 206 changes by $$\pm[(2.5 \times Ci)/(Co+nCi)][V] \quad (4)$$

When the input voltage of the inverter 206 changes from the second reset voltage, i.e., the value near the logic inversion amplitude, the output voltage of the inverter 206 is positively or negatively inverted. When signals are respectively input to the N input terminals IN-1 to IN-n, the sum of N capacitance division outputs is input to the input terminal of the inverter 206. As a result, a High- or Low-level signal appears at the output terminal 211 of the sense amplifier 205 in accordance with a potential change input to input terminal side (a) of each capacitance.

With the above arrangement, a circuit for performing stable, reliable, and high-speed parallel arithmetic operations without noise with respect to multiple input signals to multiple input terminals is realized. In addition, this circuit can be constituted by transistors smaller in number than that of a general binary logic circuit. The circuit is therefore suitable for a reduction in power consumption as well as an increase in operation speed.

[Third Embodiment]

Figure 6:
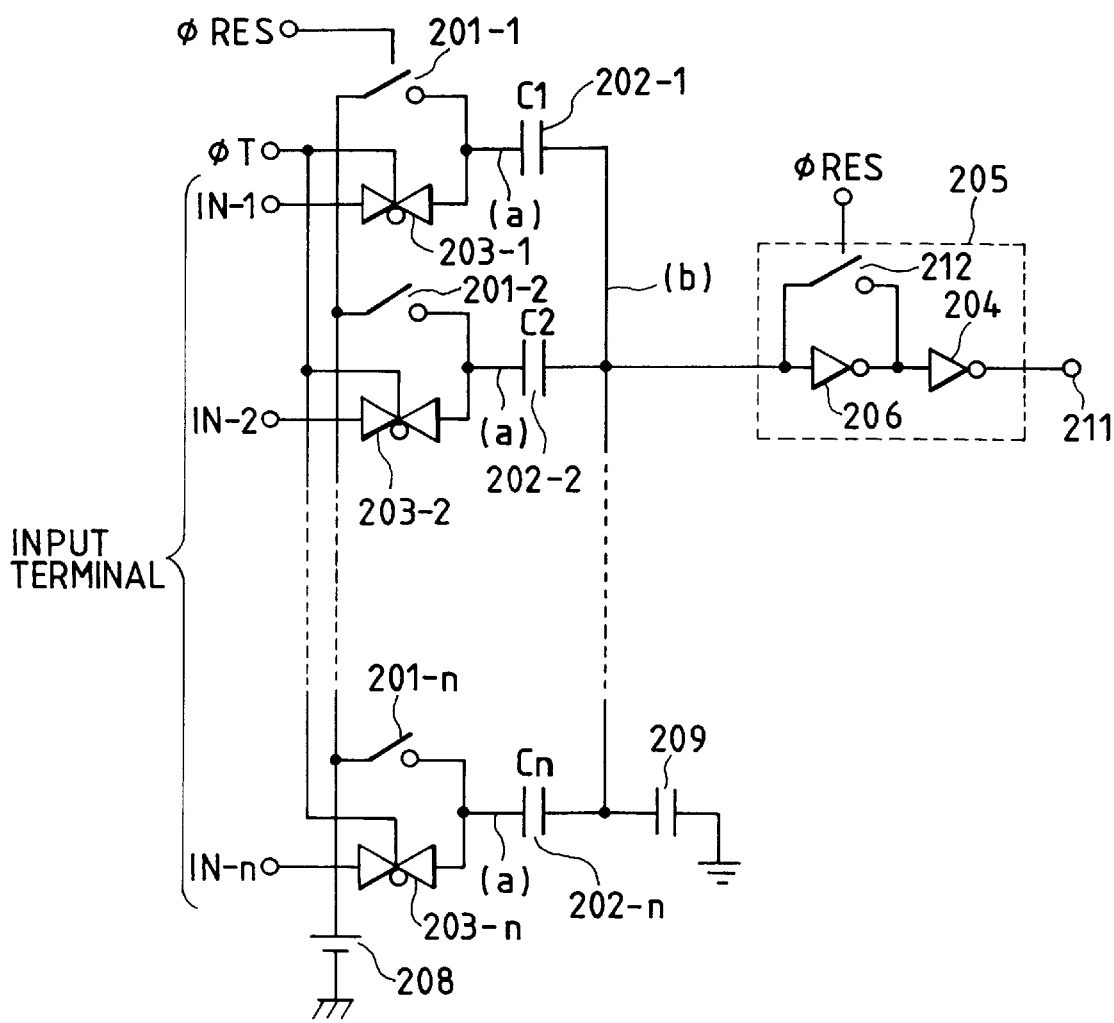

FIG. 6 shows the third embodiment of the present invention. Referring to FIG. 6, this circuit includes n input terminals IN-1 to IN-n as multiple input terminals, n input operation capacitors 202-1 to 202-n, reset switches 201-1 to 201-n corresponding to n inputs, signal transfer switches 203-1 to 203-n corresponding to the n inputs, a sense amplifier 205, an inverter 206 in the sense amplifier 205, a second inverter 204 in the sense amplifier 205, a reset switch 212 for connecting/disconnecting the input-output path of the inverter 206, a reset power supply 208 connected to one terminal of each of the reset switches 201-1 to 201-n, an output terminal 211, and a parasitic capacitance 209 including the inverter input capacitances in the capacitors 202-1 to 202-n and the sense amplifier 205. The values of the input operation capacitors 202-1 to 202-n may be the same or different.

The above operation timing shown in FIGS. 5A to 5C can be applied to this embodiment. The operation of the embodiment will be described with reference to FIGS. 5A to 5C. All the input terminal (a) sides of the input operation capacitors 202-1 to 202-n are simultaneously reset to the DC potential determined by the reset power supply 208 by using a reset pulse $\phi_{RES}$. If, for example, the power supply voltage is a 5-V system, about half of the power supply voltage, i.e., about 2.5 V, is used as the reset voltage 208. The reset voltage is not limited to this voltage, and a different voltage may be used.

At almost the same time, the reset switch 212 for electrically connecting the input and output terminals of the inverter 206 in the sense amplifier 205 is turned on in synchronism with the reset pulse $\phi_{RES}$. When the input and output terminals of the inverter 206 are rendered conductive, the input/output terminal voltage finally converges to a logic inversion voltage value by negative feedback. When the input of the inverter 206 is larger than the logic inversion voltage value, the output goes to Low level. When the input is smaller than the logic inversion voltage value, the output goes to High level.

When the reset pulse $\phi_{RES}$ is disabled, input side (a) of the capacitor 202 is reset to the reset voltage value of the reset voltage source 208, and common connection side (b) of the capacitor 202 is reset to a value near the logic inversion voltage of the inverter 206. As a result, the two terminals of the capacitor 202 are reset.

Subsequently, the transfer switches 201-1 to 201-n are turned on by a transfer pulse $\phi_T$ to respectively transfer the signals to the input operation capacitors 202-1 to 202-n.

Assume that each of the n input operation capacitors 202-1 to 202-n has a capacitance value Ci, and the parasitic capacitance has a capacitance value Co. In this case, when the voltage of one input terminal of the common connection portion (b) changes, the potential of one terminal of common connection portion (b), i.e., the inverter 206, changes with respect to the reset voltage owing to capacitance division by $$(Ci \times V)/(Co+nCi)[V] \quad (5)$$

where V is the voltage change of the input voltage. If, for example, the potential of input terminal side (a) is reset to 2.5 V, the above potential changes from the reset voltage to 0 V corresponding to Low level or 5 V corresponding to High level. That is, when a change of ±2.5 V from the reset voltage is input, the potential changes from the input reset potential of the inverter 206 changes by $$+[(2.5 \times Ci)/(Co+nCi)][V] \quad (6)$$

When the input voltage of the inverter 206 changes from the reset voltage, i.e., the value near the logic inversion amplitude, the output voltage of the inverter 206 is inverted. When signals are respectively input to the N inputs, the sum of N capacitance division outputs is input to the input terminal of the inverter 206. As a result, a High- or Low-level signal appears at the output terminal 211 of the sense amplifier 205 in accordance with a potential change input to input terminal side (a) of each capacitance.

With the above arrangement, the input terminal of the inverter 206 accurately converges to the logic inversion potential value by the input/output negative feedback effect of the inverter 206. Even if, therefore, the logic inversion voltage value varies due to manufacturing variations, the input terminal of the inverter automatically converges to the logic inversion voltage. For this reason, a multiple input logic circuit capable of an accurate arithmetic operation can be realized. In addition, since this circuit performs parallel arithmetic operations at a high speed with respect to multiple input signals, both an increase in operation speed and a reduction in power consumption can be realized with an arrangement having transistors smaller in number than a general binary logic circuit.

[Fourth Embodiment]

Figure 7:
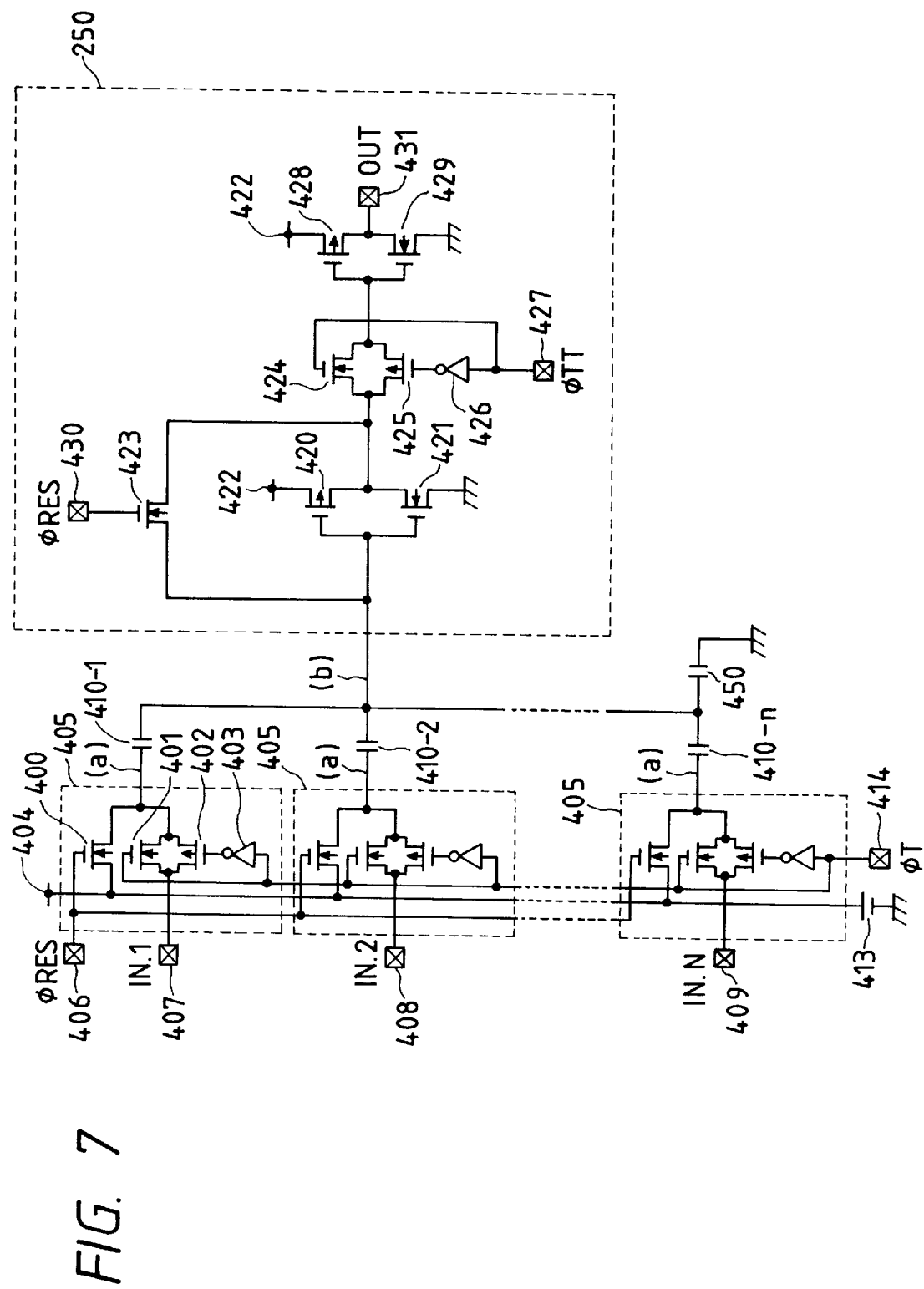

FIG. 7 is a circuit diagram showing the fourth embodiment using the third embodiment. Referring to FIG. 7, the gate, source, and drain of an NMOS transistor 400 serving as a reset switch are respectively connected to a reset control signal $\phi_{RES}$ 406, a reset voltage 413, and an input operation capacitor 410-1. A power supply symbol 404 is set to the same potential as the reset voltage 413, and is used afterward. A pair of an NMOS transistor 401 and a PMOS transistor 402 constitute a transmission gate, which is used as a signal transfer switch. The drain and source terminals of the MOS transistor 401 are respectively connected to those of the PMOS transistor 402. The gate of the NMOS transistor 401 is connected to a transfer control signal $\phi_T$ 414. The gate of the PMOS transistor 402 is connected to the transfer control signal $\phi_T$ 414 through an inverter 403. An input switch unit 405 corresponding to one input has the reset switch 400 and the transfer gates 401 and 402 for signal transfer.

If there are n input terminals IN-1 407, IN-2 408, ..., IN-N 409, n input switch units 405 are prepared in correspondence with the n input terminals. If there are n inputs, this circuit includes n input operation capacitors 410-1 to 410-n. One terminal of each of the input operation capacitors 410-1 to 410-n is connected to the output of a corresponding one of the input switch units, i.e., the contact between the drain terminal of each reset NMOS transistor 400 and the common drain terminal of each NMOS transistor 401 and each PMOS transistor which constitute the transmission gate. One terminal of each input operation capacitor receives a reset voltage or signal information. The circuit also includes a parasitic capacitance 450 at the contact between the common terminal of the input operation capacitors 410-1 to 410-n and the input terminal of a sense amplifier 250.

The internal circuit of the sense amplifier 250 will be described next. The sense amplifier 250 includes a pair of NMOS and PMOS transistors 421 and 420 which constitute a first inverter. The source and drain of the NMOS transistor 421 are respectively connected to GND and the drain of the PMOS transistor 420. The source of the PMOS transistor 420 is connected to a power supply voltage 422. The gate of the NMOS transistor 421 is connected to the gate of the PMOS transistor 420. The contact between the gates is connected to the common connection terminal of the input operation capacitors 410-1 to 410-n and one terminal (drain or source) of a second reset switch constituted by an NMOS transistor 423.

The output of the first inverter, i.e., the contact between the drain of the PMOS transistor 420 and the drain of the NMOS transistor 421, is connected to the other terminal of the NMOS transistor 423 and the input of a transmission gate constituted by NMOS and PMOS transistors 425 and 424. The drain and source of the NMOS transistor 425 are respectively connected to the drain and source of the PMOS transistor 424. The gate of the PMOS transistor 424 is directly connected to a control signal $\phi_{TT}$ 427. The gate of the NMOS transistor 425 is connected to the control signal $\phi_{TT}$ through an inverter 426. A second inverter constituted by NMOS and PMOS transistors 429 and 428 is connected to the output terminal of the transmission gate. The output of the second inverter, i.e., the contact between the drains of the PMOS 428 and NMOS 429, becomes a logic output and is output to an external unit.

The timing chart in FIG. 5 can be applied to the circuit operation of this circuit. FIG. 7 shows the transistor element of the third embodiment in more detail. The operation principle of this element is the same as that of the fourth embodiment.

Input terminal (a) of each of the input operation capacitors 410-1 to 410-n is reset to the DC potential determined by the reset power supply 413 by using the reset pulse $\phi_{RES}$ through the reset switch NMOS 400. If, for example, the power supply voltage is a 5-V system is used, about half of the power supply voltage, i.e., about 2.5 V, is used as the reset power supply 413. The reset voltage $V_R$ is not limited to this voltage, and a different voltage may be used.

At almost the same time, the reset switch NMOS transistor 423 for electrically connecting the input and output of the inverter constituted by the NMOS and PMOS transistors 421 and 420 in the sense amplifier is turned on in synchronism with the reset control signal $\phi_{RES}$. When the input and output terminals constituted by the NMOS and PMOS transistors 421 and 420 of the inverter are rendered conductive, the output is negatively fed back to the input in an opposite phase. Finally, the input/output terminal converges to the logic inversion voltage value. That is, when the input of the inverter constituted by the NMOS and PMOS transistors 421 and 420 is larger than the logic inversion voltage value, the output goes to Low level. When the input is smaller than the logic amplitude, the output goes to High level. As a result, the output converges to the logic inversion voltage value.

When the reset pulse $\phi_{RES}$ is disabled, input side (a) of each of the input operation capacitors 410-1 to 410-n is reset to the reset voltage value of the reset voltage source 413, and common connection side (b) of the input operation capacitors 410-1 to 410-n is reset to the logic inversion voltage value of the inverter constituted by the NMOS and PMOS transistors 421 and 420. With this operation, the two terminals of each of the input operation capacitors 410-1 to 410-n is reset.

Subsequently, the transfer switch NMOS transistor 401 and the PMOS transistor 402 are turned on by a transfer pulse $\phi_T$ to transfer the input signals to the input operation capacitors 410-1 to 410-n.

Assume that each of the n input operation capacitors 410-1 to 410-n has a capacitance value Ci, and the parasitic capacitance has a capacitance value Co. In this case, one terminal of common connection portion (b) changes with respect to a potential change at one input terminal by capacitance division. As a result, common connection portion (b), i.e., the potential of the inverter constituted by the NMOS and PMOS transistors 421 and 420 changes by $$(Ci \times V)/(Co + nCi)[V] \tag{7}$$

where V is the voltage change of the input voltage. If, for example, the potential of input terminal side (a) is reset to 2.5 V, the above potential changes from the reset voltage to 0 V corresponding to Low level or 5 V corresponding to High level. That is, when a change of ±2.5 V from the reset voltage is input, the potential of common connection portion (b) changes from the input reset voltage of the inverter constituted by the NMOS and PMOS transistors 421 and 420 by $$\pm[(2.5 \times Ci)/(Co+nCi)][V] \tag{8}$$

When the input voltage of the inverter constituted by NMOS and PMOS transistors 421 and 420 changes from the reset voltage, i.e., the logic inversion voltage value, the output voltage of the inverter constituted by the NMOS and PMOS transistors 421 and 420 is positively or negatively inverted in accordance with the change.

When signals are respectively input to N inputs, the sum of N capacitance division outputs is input to the input terminal of the inverter constituted by the NMOS and PMOS transistors 421 and 420. As a result, the output of the inverter constituted by the NMOS and PMOS transistors 421 and 420 changes from the reset voltage in accordance with a potential change input to input terminal side (a) of each capacitance. When this change is stabilized to a certain degree, the control signal $\phi_{TT}$ 427 is activated to turn on the transmission gate constituted by the NMOS and PMOS transistors 424 and 425, thereby transferring a signal to the input gate of the second inverter constituted by the NMOS and PMOS transistors 429 and 428. As a result, logical High level or Low level is determined and output from the output 431 of the second inverter, i.e., the output of the sense amplifier 205.

With the above arrangement, the input terminals of the inverters accurately converge to the logic inversion voltage value in a reset operation by the input/output negative feedback effect of the inverters. For this reason, even if there are variations in logic inversion voltage value owing to manufacturing variations, the input terminals of the inverters are automatically made to converge to the logic inversion voltage. Therefore, a multiple input logic circuit capable of a high-precision arithmetic operation can be achieved. In addition, since this circuit performs parallel arithmetic operations at a high speed with respect to multiple input signals, both an increase in operation speed and a reduction in power consumption can be realized with an arrangement having transistors smaller in number than a general binary logic circuit.

[Fifth Embodiment]

Figure 8:
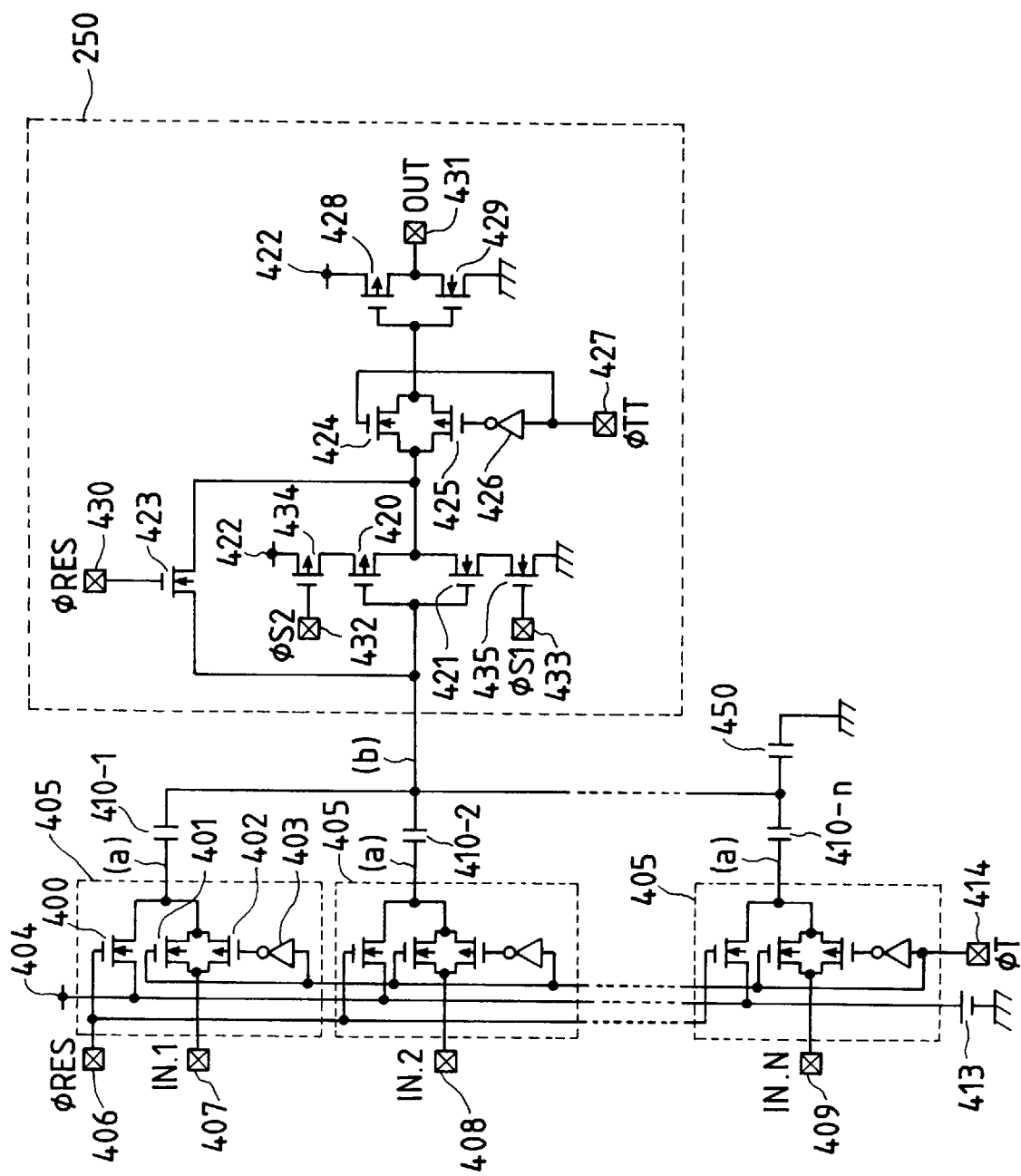

Another circuit arrangement of the sense amplifier portion will be described as the fifth embodiment with reference to FIG. 8. The same reference numerals in FIG. 8 denote parts having the same functions as those in FIG. 7, and a detailed description thereof will be omitted.

The arrangement of this embodiment is different from that of the fourth embodiment in that the inverter constituted by the NMOS and PMOS transistors 421 and 420 in the sense amplifier 250 is disconnected from a power supply line 422 and GND in the unused state of the inverter to prevent a through current from flowing in the inverter, thereby further reducing the power consumption.

This arrangement will be described in more detail. The source of the NMOS transistor 421 is not connected to GND but is connected to the drain of an NMOS transistor 435 used as a switch. The source of the PMOS transistor 420 is not connected to the power supply line 422 but is connected to the drain of a PMOS transistor 434 used as a switch. The source and gate of the NMOS transistor 435 are respectively connected to GND and a control terminal 433 to which a control signal $\phi_{S1}$ is input. The source and gate of the PMOS transistor 434 are respectively connected to the power supply line 422 and a control terminal 432 to which a control signal $\phi_{S2}$ is input.

This circuit basically operates as follows. When transfer of an input signal is completed, and the output of the first inverter changes, the transfer gate is opened to transfer the signal to the second inverter. Thereafter, the control signal $\phi_{S1}$ is set at Low level at which the NMOS transistor 435 is turned off, and the control signal $\phi_{S2}$ is set at High level at which the PMOS transistor 434 is turned off, thereby turning off the inverter constituted by the first NMOS and PMOS transistors 421 and 420. With this operation, the generation of an unnecessary through current is prevented while the chopper inverter used in the sense amplifier 250, i.e., the inverter constituted by the NMOS and PMOS transistors 421 and 420, is not used, thereby realizing a reduction in power consumption. Since the operation of this embodiment is almost the same as that of the fourth embodiment, a description thereof will be omitted.

[Sixth Embodiment]

Still another circuit arrangement of the sense amplifier will be described as the sixth embodiment with reference to FIG. 9. The same reference numerals in FIG. 9 denote parts having the same functions as those in FIGS. 7 and 8, and a detailed description thereof will be omitted.

The arrangement of this embodiment is different from the arrangement of the fourth or fifth embodiment in that a positive feedback amplifier using a latch amplifier circuit is used in a sense amplifier 205 instead of the chopper inverter.

Figure 9:
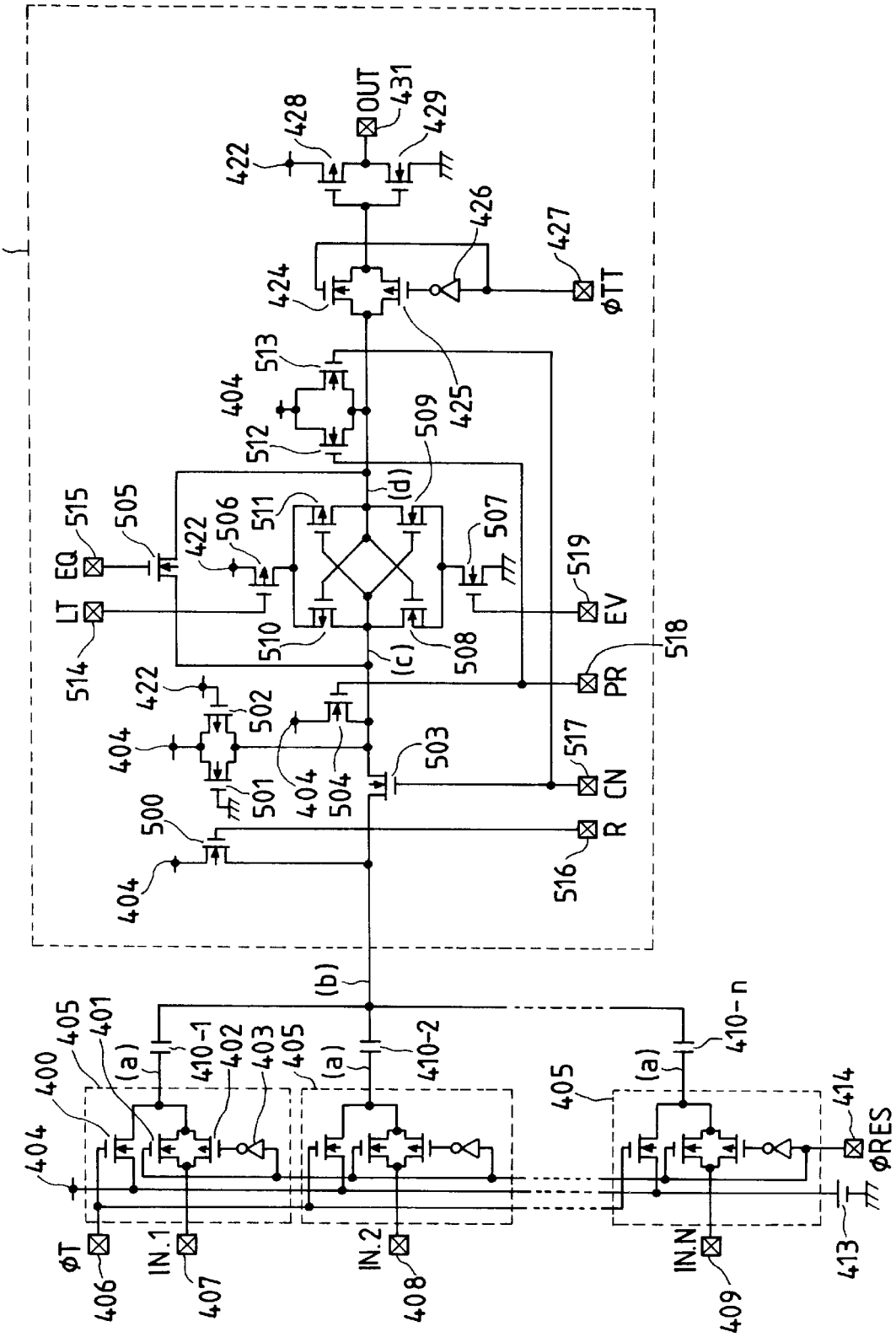
Figure 10:
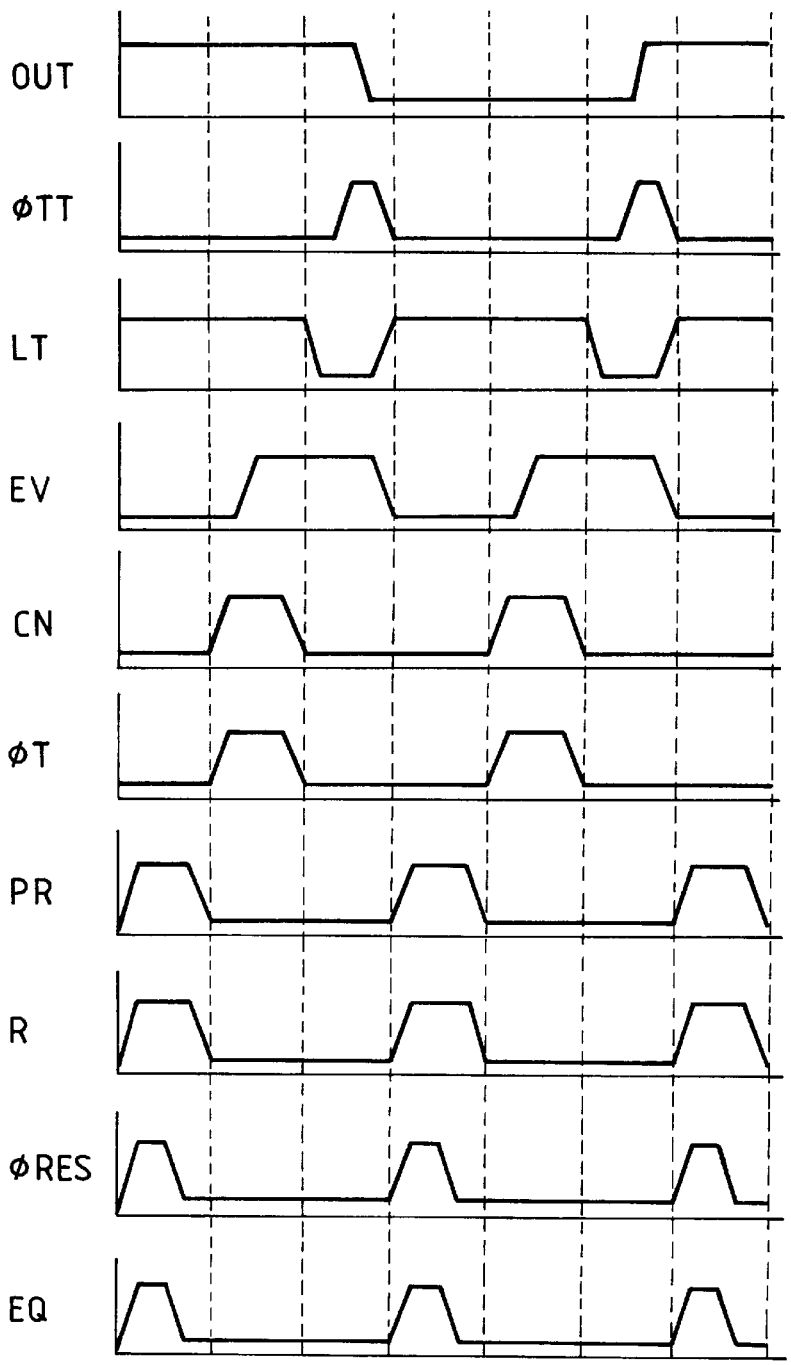

Referring to FIG. 9, NMOS transistors 508 and 509 have a common source terminal while their gates are respectively connected to the drains of the transistors on the opposite sides. PMOS transistors 510 and 511 have a common source terminal while their gates are respectively connected to the drains of the transistors on the opposite sides. The contact between the drain of the NMOS transistor 508 and the gate of the NMOS transistor 509 is commonly connected to the contact between the drain of the PMOS 510 and the gate of the PMOS 511. This common contact serves as input terminal (c) of the latch amplifier. The contact between the drain of the NMOS transistor 509 and the gate of the gate of the NMOS transistor 508 is commonly connected to the contact between the drain of the PMOS transistor 511 and the gate of the PMOS transistor 510. This common contact serves as output terminal (b). With this arrangement, a latch type sense amplifier is formed.

FIGS. 10A to 10J are timing charts for explaining the operation of this embodiment. The operation of the sixth embodiment will be described with reference to FIGS. 10A to 10J. A control transfer pulse signal $\phi_T$ and a reset pulse signal $\phi_{RES}$ on the multiple input side are used as follows. As described in the third embodiment, input terminal side (a) of each of input operation capacitors 410-1 to 410-n is reset by using the reset control signal $\phi_{RES}$, and an input signal is transferred by using the control signal $\phi_T$. When the input operation capacitors 410-1 to 410-n are reset by the control signal $\phi_{RES}$, a control signal R at a control terminal 516 is simultaneously activated to reset common connection side (b) of the input operation capacitors 410-1 to 410-n to a reset potential 404 through an NMOS transistor 500. At almost the same time, a control signal PR is activated to reset input point (c) and output point (d) of the latch type sense amplifier to the reset potential 404 through NMOS transistors 504 and 512. At this time, a second signal transfer switch NMOS transistor 503 is turned off to electrically disconnect common connection portion (b) of the input operation capacitors 410-1 to 410-n from input point (c) of the latch type sense amplifier, thereby resetting the respective points.

With this operation, identical load parasitic capacitances are equivalently added to the input and output terminals of the latch type sense amplifier 205 so that an accurate reset operation can be performed. NMOS and PMOS transistors 501 and 502 have a common drain and a common source. The source and the drain are respectively connected to the reset power supply and input terminal (c) of the latch type sense amplifier. The gate of the NMOS transistor 501 is connected to GND, and the gate of the PMOS transistor 502 is connected to a power supply 422. Both the transistors are in an OFF state. The output transfer gate constituted by the NMOS and PMOS transistors 425 and 424 in the fourth embodiment is connected to point (d). For this reason, this arrangement is designed to add a capacitance equivalent to the parasitic capacitance in the output transfer gate to input terminal (c). Similarly, an NMOS transistor 513 serves to add an equivalent parasitic capacitance to output terminal (d) through the second signal transfer switch NMOS transistor 503. In addition, the NMOS transistor 513 generates noise equivalent to noise generated when the second signal transfer NMOS transistor 503 is turned on, thereby preventing the above operation of the sense amplifier.

Referring back to the above description, while points (a), (b), (c), and (d) are being reset in the initial reset operation, the latch type sense amplifier 205 is set in an OFF state by the NMOS and PMOS transistors 507 and 506. The source, drain, and gate of the NMOS transistor 507 are respectively connected to GND, the common source of the NMOS transistors 508 and 509 of the latch type sense amplifier, and a control signal EV at a control terminal 519. The source, drain, and gate of the PMOS transistor 506 are respectively connected to the power supply 422, the common source of the PMOS transistors 510 and 511 of the latch type sense amplifier, and a control signal LT at a control terminal 514. When the respective points are reset, the control signal EV is at Low level, and the control signal LT is at High level. The NMOS witch 507 and the PMOS switch 506 are in an OFF state. In order to accelerate the conversion of points (d) and (c) to the reset potential, this circuit includes an equalizer switch NMOS transistor 505 for rendering the input-output path conductive. The source (or drain), drain (or source), and gate of the equalizer switch NMOS transistor 505 are respectively connected to point (c), point (d), and a control signal EQ at a control terminal 515.

The equalizer switch NMOS transistor 505 is turned on by the control signal EQ at the same time an initial reset operation is performed, and it is turned off immediately before a reset operation is completed. With this operation, input and output points (c) and (d) of the latch type sense amplifier are reset at a high speed.

Subsequently, the control signal $\phi_{RES}$ is disabled, and resetting of input terminal (a) of each of the input operation capacitors 410-1 to 410-n is completed. At the same time or with a slight delay, the control signals R and RP are disabled to complete the reset operation. When the transfer control signal $\phi_T$ is enabled and input signals are input to the input terminals of the input operation capacitors 410-1 to 410-n in this state, the sum of capacitor division outputs corresponding to the N input signals changes as a change at common connection side (b). At the same time or with a slight delay with respect to this change, the control signal CN is activated to turn on the second signal transfer NMOS transistor 503 so as to transmit the signal to input point (c) of the latch type amplifier.

While the second signal transfer NMOS transistor is kept on, the control signal EV is activated first to turn on the switch NMOS transistor 507, and the control signal CN is then disabled. Subsequently, the control signal LT is set at Low level to completely turn on the latch type amplifier. At this time, if the potential at the input point rises with respect to the reset potential, points (c) and (d) quickly converge to High level and Low level, respectively, by positive feedback. If the potential drops with respect to the reset potential, points (c) and (d) quickly converge to Low level and High level, respectively, by positive feedback.

Since only slight currents flow in the latch type sense amplifier when a reset operation is performed and a signal changes in level, end a positive feedback effect is used, the gain is high. Therefore, high-speed response can be realized with a high gain and low power consumption.

In order to make this latch type sense amplifier properly process even small input signals, the reset control pulse signal $\phi_{RES}$ and an inverted pulse $\overline{\phi RES}$ are input to the input terminal of the sense amplifier through a certain equivalent circuit. By connecting this equivalent circuit, a voltage change caused by overlapping capacitances in the gate and drain of the NMOS transistor which are generated when the transistor is turned off can be canceled out. Each terminal can therefore be reset to a desired potential with higher accuracy. As the equivalent circuit, for example, a capacitance or a circuit constituted by PMOS and NMOS transistors having common drain and source terminals may be used. Since each input terminal can be reset with higher accuracy by connecting such an equivalent circuit, the potential of the input terminal of the sense amplifier can be accurately set. This allows the sense amplifier to properly process even small signals which change through capacitances.

Similarly, the respective NMOS switches to which the control signals R, CN, and PR are supplied can properly operate with respect to even small signals by using the above technique.

[Seventh Embodiment]

Still another circuit arrangement of the sense amplifier portion will be described next as the seventh embodiment with reference to FIG. 11. The same reference numerals in FIG. 11 denote parts having the same functions as those in FIGS. 7, 8, and 9, and a detailed description thereof will be omitted.

The arrangement of the seventh embodiment is different from the fifth embodiment in that a differential amplifier is used for a sense amplifier in place of the chopper inverter in the fifth embodiment.

Figure 11:
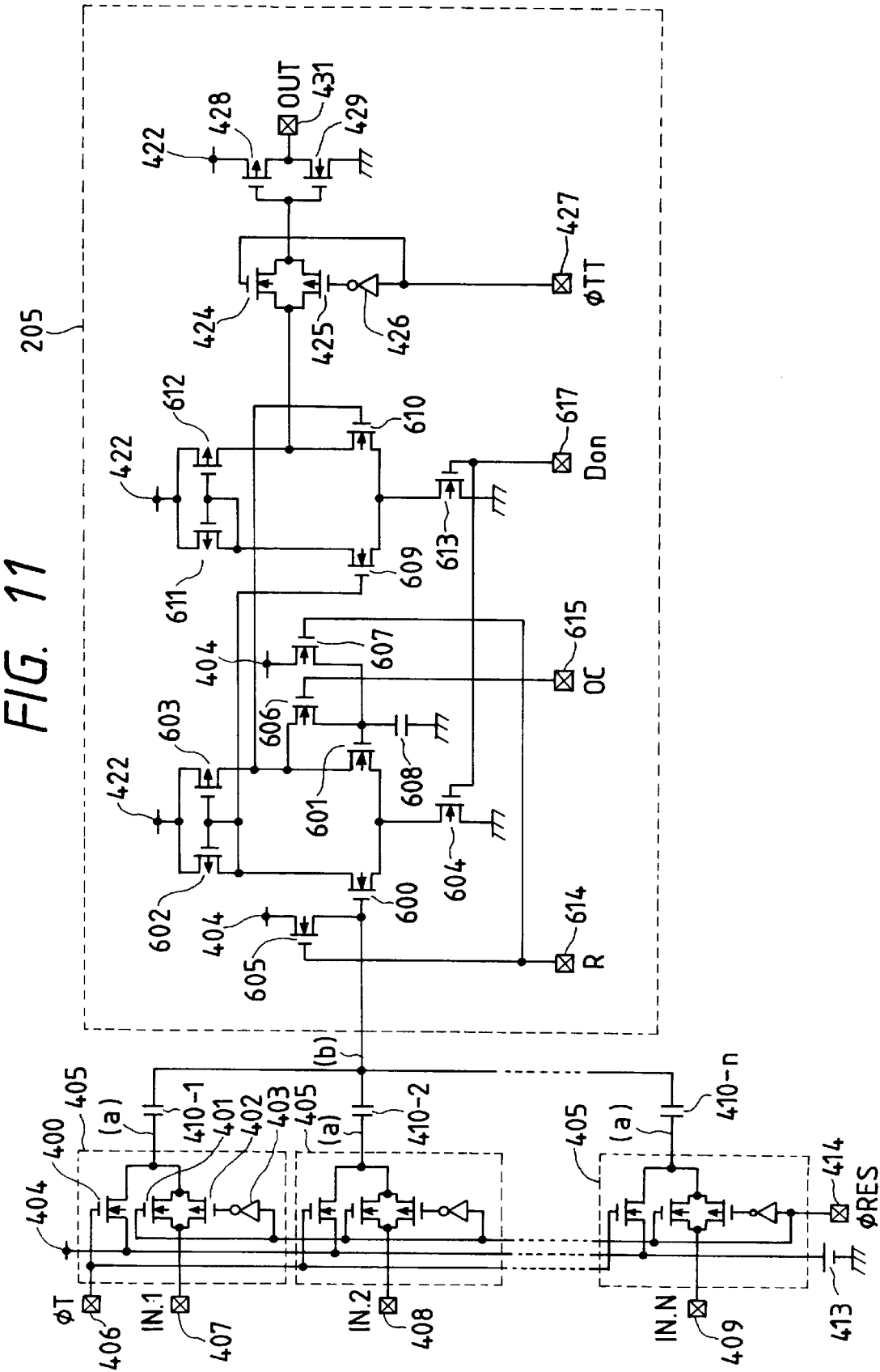

Referring to FIG. 11, NMOS transistors 600 and 601 constitute a differential pair having a common source. The NMOS transistors 600 and 601 respectively have PMOS active loads 602 and 603 as loads at their drains to constitute a current mirror type differential amplifier circuit. The drain and gate of the PMOS active load 602 are short-circuited and are connected to the second differential amplifier, and the contact between the NMOS transistor 601 and the PMOS active load 603 is connected as an output to the second differential amplifier. The drain of a NMOS transistor 604 is connected to the common source portion of the differential pair NMOS transistors 600 and 601 and serves as a constant current source. This constant current source is turned off when a control potential $D_{ON}$ of a control terminal 617 is equal to or lower than a threshold potential $V_{th}$, and is set to a predetermined current value upon application of an arbitrary voltage. After the control potential $D_{ON}$ is enabled to activate the first and second differential amplifiers, a control signal R at a control terminal 614 is activated to turn on a reset NMOS transistor 605. With this operation, the gate potential of the first differential amplifier is reset to a reset potential 404.

The control signal R is then turned off to set the gate of the first differential amplifier in a floating state, and an NMOS transistor 606 is turned on through a control terminal OC, thereby short-circuiting the drain and source of the NMOS transistor 601. A capacitor 608 is connected to the gate of the NMOS transistor 601. The difference in drain current between the PMOS active load 603 and the NMOS transistor 601 is charged or discharged in or from the capacitor 608.

With this operation, even if the threshold potential $V_{th}$ of the NMOS transistor is offset between the operation pair NMOS transistors 600 and 601 by a negative feedback effect, the overall differential amplifier system operates to compensate for the offset. As a result, the gate voltage of the NMOS transistor 601 is determined such that the difference in drain current between the PMOS active load 603 and the NMOS transistor 601 becomes zero. In this state, the output offset of the first differential pair is controlled to become zero, and the input offset is canceled out.

In this case, when a transfer control pulse $\phi_T$ is enabled, and signals are input to the input operation capacitors 410-1 to 410-n, the sum of capacitance division outputs corresponding to N input signals at common connection side (b), i.e., the gate of the NMOS transistor 600, changes. This change is amplified by the first differential pair NMOS transistors 600 and 601 to be input as a differential signal to second differential pair transistors NMOS and PMOS 609 and 610. The NMOS transistors 609 and 610 have a common source and respectively have PMOS active loads 611 and 612 at the drains, thus constituting a current mirror type circuit. The drain of a NMOS transistor 613 for a constant current source which is controlled by the control signal $D_{ON}$ is connected to the common source portion. This activates the second differential pair 609 and 610.

An output difference signal output from the first differential pair is input the gates of the second differential pair NMOS transistors 609 and 610 to be amplified again. As a result, a High- or Low-level signal with a logic level corresponding to the input signal is output to the contact between the drain of the PMOS active load 612 and the drain of the NMOS transistor 610.

As described above, a sense amplifier 205 has a differential amplification arrangement, and each differential pair has an offset cancel function. With this arrangement, determination of small signals can be performed from the high gain of differential amplification. Even if, therefore, the number of multiple input terminals increases, a differential gain can be ensured in accordance with this increase, and accurate response determination can be realized. Consequently, a decrease in the number of transistors, an increase in operation speed, and a reduction in power consumption can be realized.

[Eighth Embodiment]

Figure 12:
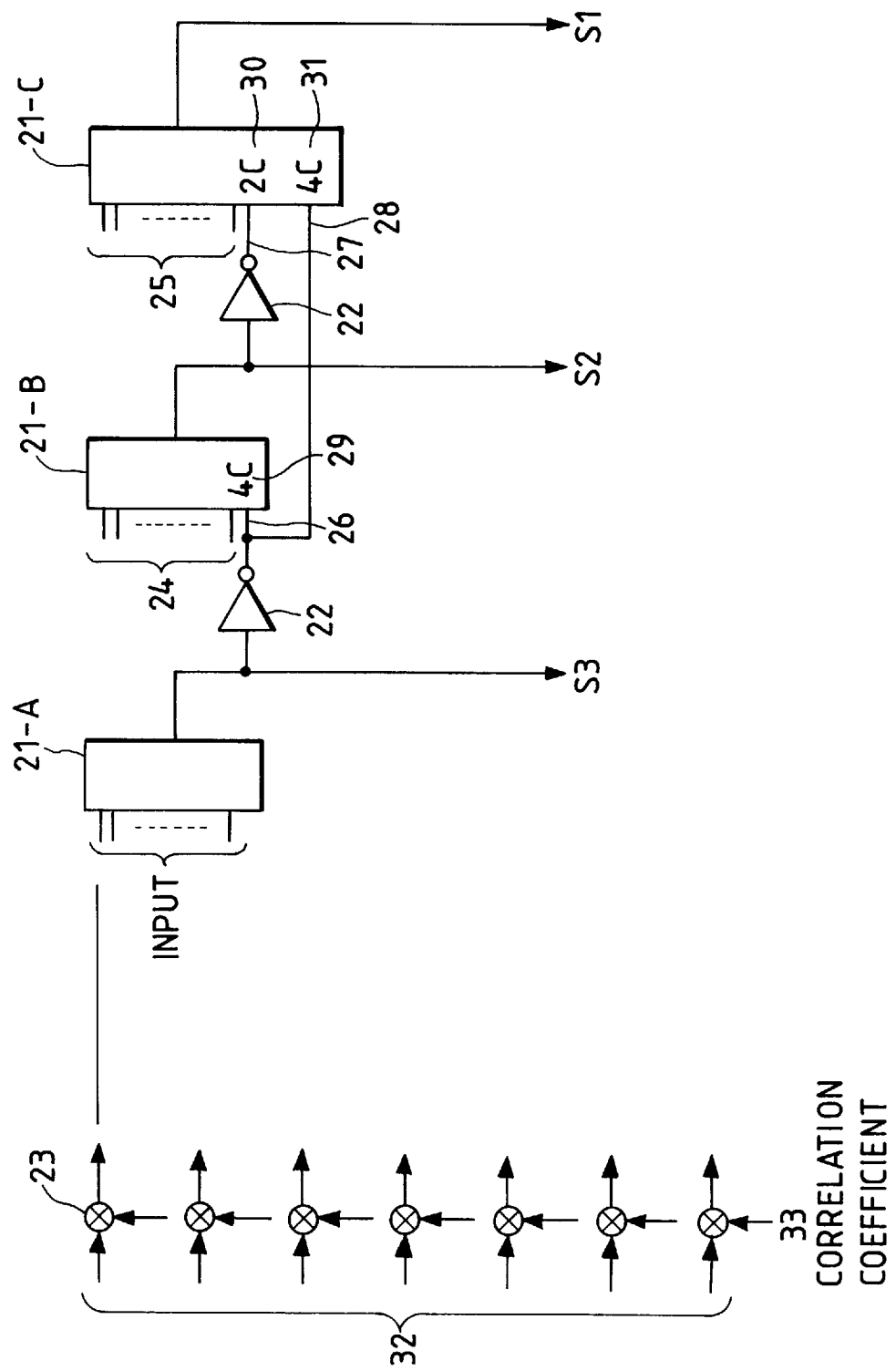
FIGS. 12 and 16 are schematic block diagrams for explaining the operating devices of the present invention, respectively.

The eight embodiment in which the above semiconductor device is applied to a correlation calculating circuit will be described next with reference to FIG. 12. Referring to FIG. 12, this circuit includes a majority operation circuit blocks 21-A, 21-B, and 21-C, each having seven input terminals, inverters 22, comparators 23, input terminal groups 24 and 25 to which signals similar to seven input signals input to the majority operation circuit block 21-A are input, input terminals 26, 27, and 28 for receiving output signals from the preceding majority operation circuit blocks, and capacitors 29, 30, and 31 respectively connected to the input terminals 26, 27, and 28. When a capacitance connected to a general input terminal is represented by C, the capacitors 29, 30, and 31 respectively have capacitance values 4C, 2C, and 4C.

Referring to FIG. 12, input signals are respectively input to the comparators 23 together with correlation coefficients 33. Each comparator 23 outputs a High-level signal when the input signal and the correlation coefficient 33 coincide with each other. Otherwise, the comparator 23 outputs a Low-level signal. The outputs from the comparators 23 are respectively input to the majority calculation circuit blocks 21-A to 21-C. Assume that outputs from the comparators 23 are input to the seven-input majority operation circuit block 21-A. In this case, if the majority of the inputs are at High level, i.e., four or more of the seven inputs are at High level, the majority operation circuit block 21-A outputs a High-level signal. This output state is indicated by "S3" in Table 1.

TABLE 1

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

Similarly, the 11-input majority operation circuit block 21-B, which has, for example, the capacitance value 4C equivalent to seven inputs and the four inputs of the input terminal 26, outputs a High-level signal when six or more inputs of the seven input terminals are at High level (since an output from the inverter 22 is at Low level, no signal is input to the input terminal 26). This output state is indicated by "S2" in Table 1. Assume that both the blocks 21-A and 21-B are set at High level. In this case, the majority operation circuit block 21-C having a total of 13 inputs, which has the capacitance value 4C equivalent to seven inputs and the four inputs of the input terminal 28 and the capacitance value 2C equivalent to the two inputs of the input terminal 27, outputs a High-level signal when seven or more High-level signals are input to the seven input terminals. This output state is indicated by "S1" in Table 1.

Figure 13:
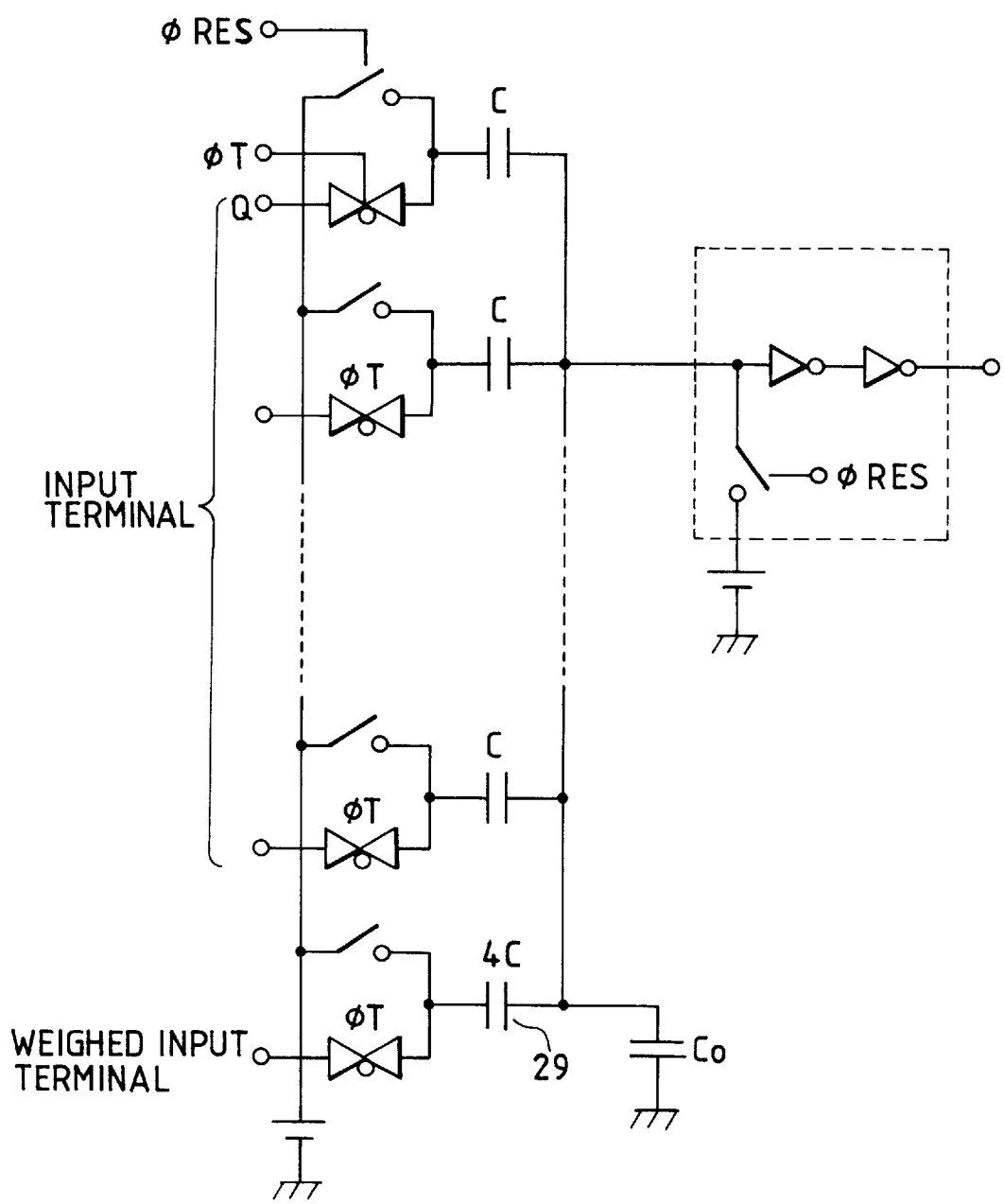

More specifically, "S3" in Table 1 shows the output values from the seven-input majority operation circuit block in correspondence with the numbers of High-level signals. Subsequently, as shown in FIG. 12, the polarity of output from the seven-input majority operation circuit block 21-A is inverted by the inverter 22, and the resultant signal is supplied to the weighted input terminal 26 of the majority operation circuit block 21-B. FIG. 13 shows an example of the circuit arrangement of the majority operation circuit block 21-B. Referring to FIG. 13, the capacitor 29 has a capacitance value four times larger than that of a capacitor C connected to another input terminal path. Assume that the value of a capacitor connected to an input terminal path is represented by C. In this case, the circuit in FIG. 13 is a 11-input majority operation circuit block, in which 11 capacitors C are commonly connected, and a signal from the weighted input terminal is supplied to four capacitors of the 11 capacitors, while signals identical to those input to the majority operation circuit block 21-A are applied to the remaining seven terminals. If, for example, four or more inputs of the seven inputs of the first block 21-A are at High level, a Low-level signal is supplied to the weighted input terminal of the second block 21-B, as described above. If six or more signals of the seven signals supplied to the input terminals other than the weighted input terminal of the next block 21-B are at High level, the 11-input majority operation circuit determines that the majority of the input signals are at High level, and outputs a High-level signal. If four or more or five or less of the seven inputs of the second block 21-B are at High level, it is determined that the majority of the inputs are not at High level, and a Low-level signal is output. If three or less of the seven inputs to the first block 21-A are at High level, a High-level signal is supplied to the weighted input terminal. If, therefore, two or more or three or less of the seven inputs to the second block 21-B are at High level, since "4"+"2" or "4"+"3" is six or more and hence is determined as the majority, a High-level signal is output. If one or less of the seven inputs to the second block 21-B are at High level, since "4"+"0" or "4"+"1" is less than six, a Low-level signal is output. "S2" in Table 1 shows the output values from the majority operation circuit block 21-B in correspondence with the numbers of High-level signals.

When inverted signals of the outputs from the majority operation circuits 21-A and 21-B are respectively supplied to the two weighted terminals, of the majority operation circuit block 21-C, which respectively have the capacitance value 4C four times larger than that of the input terminal 28 and the capacitance value 2C two time larger than that of the input terminal 27, the outputs shown in "S1" in Table 1 can be obtained. With this circuit arrangement, as shown in Table 1, the number of inputs, of a plurality of inputs, at which signals and correlation coefficients coincide with each other can be output upon conversion into a binary number with three digits.

FIG. 14 is a circuit diagram showing a majority operation block. This circuit is basically the same as that shown in FIG. 4. Referring to FIG. 14, this block includes reset switches 41, capacitors 42, signal transfer switches 43, a sense amplifier 205, a first inverter 46 in the sense amplifier 205, a second inverter 44 in the sense amplifier 205, a second reset switch 47 for resetting the input terminal of the first inverter 46, a reset power supply 48, a second reset power supply 50, an output terminal 51, and a parasitic capacitance 49 at one terminal of the common connection portion of the capacitors 42. The parasitic capacitance is not limited to this.

FIGS. 15A to 15C are schematic timing charts for explaining the operation of the majority operation circuit in FIG. 14. The operation of this circuit will be described below with reference to FIGS. 15A to 15C. First of all, one terminal of each capacitor 42 is reset by a reset pulse $\phi_{RES}$. If, for example, the power supply voltage is a 5-V system, about half of the power supply voltage, i.e., about 2.5 V, is used as the reset voltage. The reset voltage is not limited to this voltage, and a different voltage may be used. At almost the same time, the input terminal of the inverter 46 in the sense amplifier 205 is reset by turning on the reset switch 47. In this case, the reset voltage is set to be a value near a logic inversion voltage at which the output of the inverter 46 is inverted.

When the reset pulse $\phi_{RES}$ is disabled, the two terminals of the capacitor 42 are held at the reset voltage. When each signal transfer switch 43 is turned on by a transfer pulse $\phi_T$, an input signal is transferred to one terminal of each capacitor 42. As a result, the potential of one terminal of the capacitor 42 changes from, e.g., a reset voltage of 2.5 V to 0 V corresponding to Low level or 5 V corresponding to High level. Assume that each capacitor 42 has a capacitance Ci, the parasitic capacitance has a capacitance value Co, and N capacitors 42 are connected in parallel. In this case, with respect to one input, the voltage of one terminal of the common connection portion of the capacitors 42 changes from the value near the logic inversion voltage of the inverter 46, by capacitance division, by $$(Ci \times V)/(Co + NCi)[V] \quad (9)$$

When the input terminal voltage of the inverter 46 changes from the logic inversion voltage, the output terminal voltage of the inverter 46 is inverted in accordance with this change. When signals are respectively input to the N inputs, the sum of capacitance division outputs is input to the input terminal of the inverter 46. If the majority signals of the N inputs are High-level signals, the input terminal of the inverter 46 shifts to a potential higher than the logic inversion voltage, and a High-level signal is output to the output terminal 51 of the sense amplifier 205. If the majority signals of the N inputs are Low-level signals, a Low-level signal is output to the output terminal 51.

With the above arrangement, the circuit shown in FIG. 14 serves as a majority operation circuit for outputting the logic value of the majority of a plurality of inputs. That is, the circuit in FIG. 4, which has been described as the second embodiment, can be made to operate as a majority operation circuit.

[Ninth Embodiment]

Figure 16:
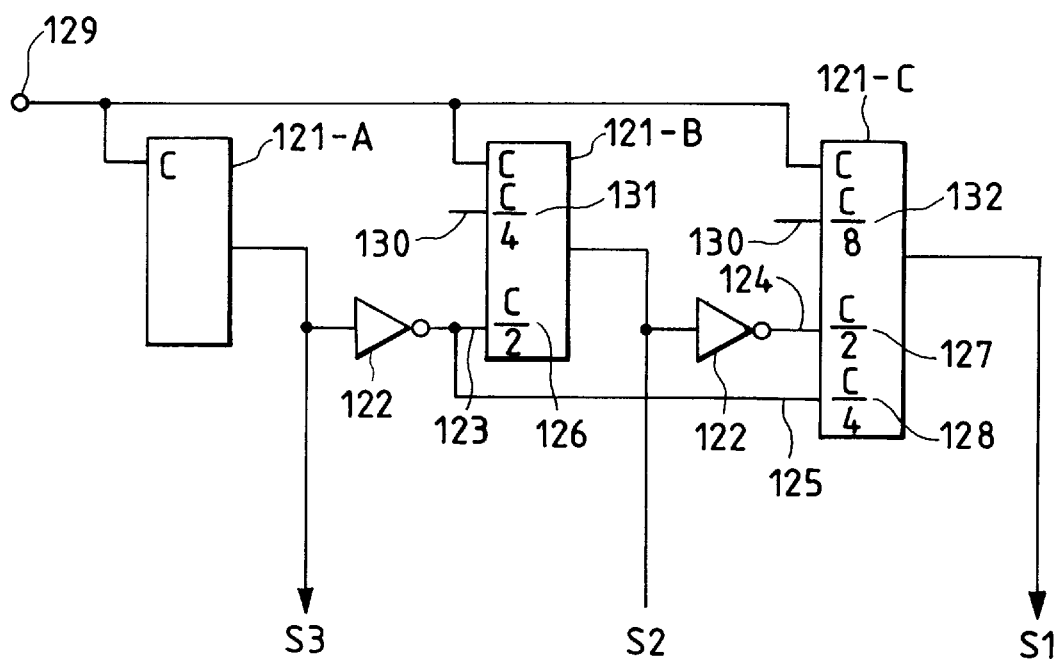

The ninth embodiment will be described with reference to FIG. 16 and Table 2. This embodiment is a three-bit analog-to-digital converter (to be referred to as an A/D converter hereinafter) using the present invention. Referring to FIG. 16, this A/D converter includes one-, two-, and three-input arithmetic circuit blocks 121-A, 121-B, and 121-C, inverters 122, input terminals 123, 124, and 125 for respectively receiving output signals from the preceding arithmetic circuit blocks, and capacitors 126, 127, and 128 respectively connected to the input terminals 123, 124, and 125. When a capacitance connected to a general input terminal is represented by C, the capacitors 126, 127, and 128 respectively have capacitance values C/2, C/2, and C/4. The A/D converter also includes an analog input terminal 129, set input terminals 130, capacitors 131 and 132 respectively having capacitance values C/4 and C/8 and respectively connected to the set input terminals 130, and digital output signal terminals S1, S2, and S3.

Assume that a 5-V power supply is used in this embodiment. Referring to FIG. 16, the sense amplifier input in the arithmetic circuit block 121-A is reset to 0 V, and the sense amplifier inputs in the arithmetic circuit blocks 121-B and 121-C are reset to about 2.5 V. In addition, the signal input terminals 123, 124, and 125 and input operation capacitors 202 at the input terminals 130 are reset to 5 V. Assume that the set input terminals 130 are set to 0 V, and the input voltage of the input terminal 129 is changed from 0 V to the analog signal voltage. In this case, if the analog input signal in the arithmetic circuit block 121-A is set at 2.5 V or more, the sense amplifier input voltage in the block exceeds the logic inversion voltage (2.5 V in this case), and a High-level signal is output. "S3" in Table 2 shows the result.

TABLE 2

| Analog Input Signal Voltage | S3 | S2 | S1 |
|---|---|---|---|
| 0.0 ≦ VA < 0.625 | 0 | 0 | 0 |
| 0.625 ≦ VA < 1.25 | 0 | 0 | 1 |

TABLE 2-continued

| Analog Input Signal Voltage | S3 | S2 | S1 |
|---|---|---|---|
| 1.25 ≤ VA < 1.875 | 0 | 7 | 0 |
| 1.875 ≤ VA < 2.5 | 0 | 1 | 1 |
| 2.5 ≤ VA < 3.125 | 1 | 0 | 0 |
| 3.125 ≤ VA < 3.75 | 1 | 0 | 1 |
| 3.75 ≤ VA < 4.375 | 1 | 1 | 0 |
| 4.375 ≤ VA < 5.0 | 1 | 1 | 1 |

When the analog input signal is 2.5 V or more, the reset voltage of the input terminal 123 changes from a reset voltage of 5 V to 0 V. In this case, a potential change at the sense amplifier input terminal in the arithmetic circuit block 121-B is given by $$\{C \times VA - (C/2) \times 5 - (C/4) \times 5\}/(C + C/2 + C/4)[V] \qquad (10)$$

where VA is the analog input signal voltage.

As is apparent from this expression, the arithmetic circuit block 121-B outputs a High-level signal when the analog signal voltage VA is 3.75 V or more, and outputs a Low-level signal when the analog signal voltage VA falls within the range of 2.5 V (inclusive) to 3.75 V (exclusive). "S2" in Table 2 shows the result.

Similarly, "S1" in Table 2 shows the outputs from the arithmetic circuit block 121-C.

According to this embodiment, as indicated by Table 2, an A/D converter for converting an analog signal voltage into a three-bit digital signal and outputting the signal can be realized with a very small arrangement, while an increase in operation speed and a reduction in power consumption are attained.

This embodiment exemplifies the three-bit A/D converter. As is apparent, the present invention is not limited to this, and can be easily applied to an A/D converter with more bits.

This embodiment exemplifies the flash type A/D converter using capacitances. However, the present invention is not limited to this. As is apparent, even if, for example, the present invention is applied to the encoder circuit portion, of an A/D converter, in which signals input to a resistor array are compared with a reference signal, and the comparison result is encoded by an encoder, the same effects as those described above can be obtained.

As described above, in a circuit block in which one terminal of each capacitance means corresponding to each of the multiple input terminals is commonly connected, a signal from the common connection portion is input a sense amplifier, if the minimum capacitance of the capacitances connected to the multiple input terminals is represented by C, the sum of the capacitances of the capacitor is almost an odd multiple of the minimum capacitance C.

Without any control input terminal, a correlation circuit is constituted by only minimum capacitances. Even with control input terminals, as described in the eighth embodiment in FIG. 12, the capacitances connected to the respective control input terminals have the capacitance values 2C and 4C, which are even numbers. The sum of these capacitance values and the capacitance values at the input signal terminals of an odd number is an odd multiple or almost an odd multiple of the minimum capacitance C. With this arrangement, a value can be clearly discriminated from a desired reference value, and hence the operation precision can be improved.

The above description is associated with a correlation circuit. If, however, the minimum bit LSB signal input capacitance of a binary D/A converter is represented by C, the next bit has a capacitance 2C, and the next bit has a capacitance 4C. That is, the capacitance C is sequentially multiplied. The sum of the capacitances at the multiple input terminals is therefore an odd multiple or an almost odd multiple of the minimum capacitance C, thereby realizing high-precision D/A conversion.

With regard to an A/D converter as well, as described in the ninth embodiment in FIG. 16, the division number for clearly determining whether an analog signal level is higher or less than ½ the full range is one (1C) in the arithmetic circuit block 121-A, and the division number for clearly determining ¼, ²⁄₄, ¾, or ⁴⁄₄ is three, i.e., an odd number, in the arithmetic circuit block 121-B. That is, the sum of these values is an odd number, i.e., an odd multiple, according to 1+2+4=7 with C/4 being regarded as the minimum value. In the arithmetic circuit block 121-C, C/8 is regarded as the minimum value, and C/4, C/2, and C, i.e., multiples of C, are set, so that 1+2+4+8=15, i.e., an odd multiple, is set.

With these arrangements, since high-precision arithmetic operations can be performed, arithmetic operations can be executed without using an unnecessarily large capacitance. Therefore, a reduction in power consumption and an increase in operation speed can be realized.

The above embodiment exemplifies the correlation calculating device and the A/D converter. However, the present invention is not limited to them. As is apparent, the same effects as those described above can be obtained even if the present invention is applied to a logic circuit such as an digital-to-analog converter, an adder, or a subtracter.

Assume that the present invention is applied to a D/A converter. In this case, if a capacitance for receiving LSB data is represented by C, binary digital-to-analog conversion can be realized by sequentially multiplying the capacitance C into 2C, 4C, and 8C in accordance with upper bits. In this case, a signal at a terminal of a commonly connected capacitance may be received by a MOS source follower amplifier.

[Tenth Embodiment]

Figure 18A:
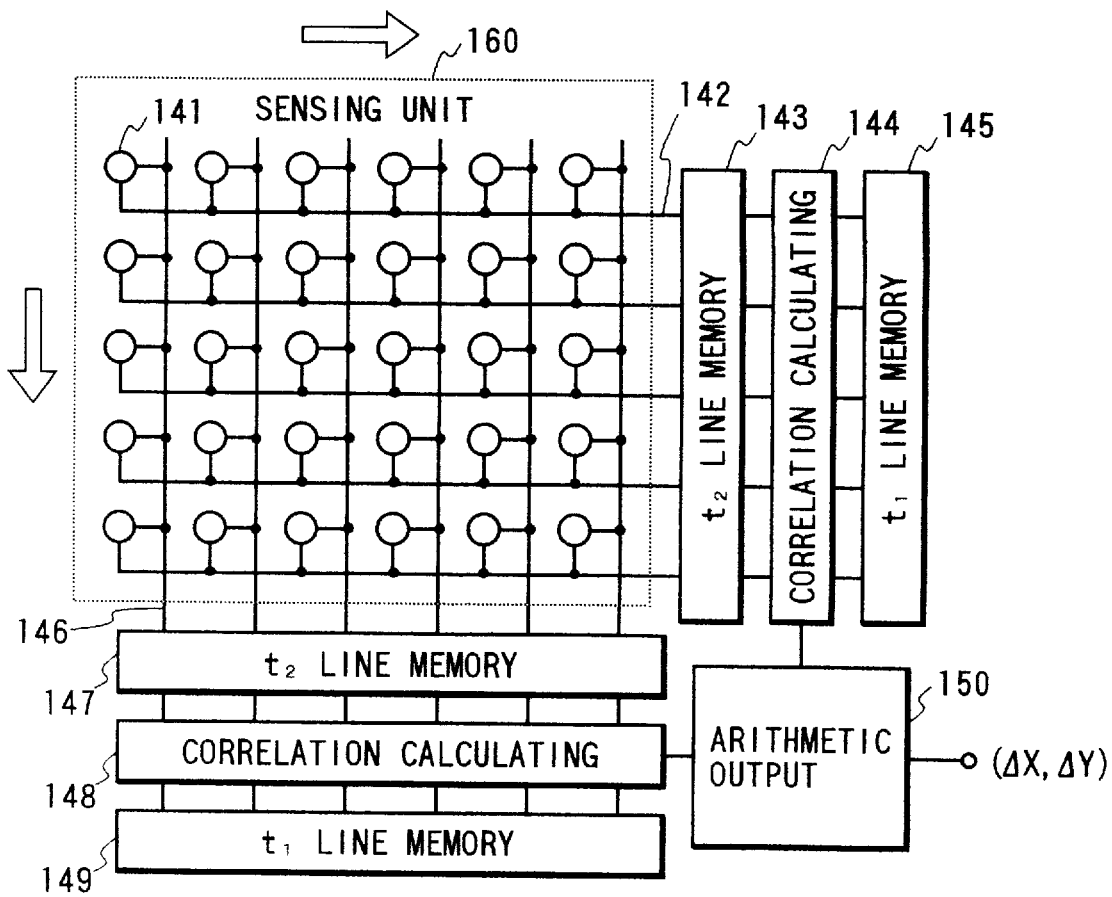
FIG. 18A is a schematic block diagram for explaining a signal processing system using the semiconductor device of the present invention.
Figure 18B:
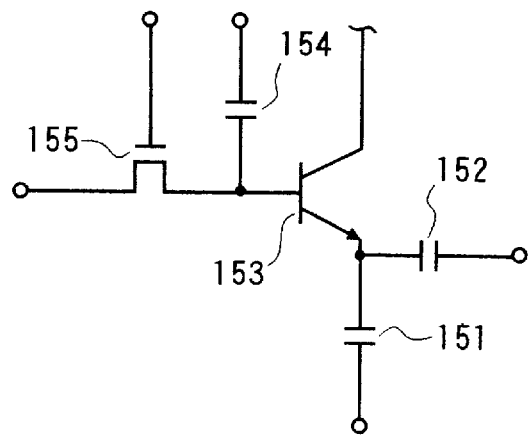
FIG. 18B is a schematic equivalent circuit diagram for explaining the arrangement of a pixel portion.

FIGS. 18A and 18B show the 10th embodiment of the present invention. In the 10th embodiment, the techniques of the present invention and the conventional circuit techniques are combined together to realize a motion detection chip for a moving image or the like. Referring to FIG. 17, the motion detection chip includes memory units 161 and 162 respectively storing standard data and reference data, a correlation calculating unit 163, a control unit 164 for controlling the overall chip, an adder 165 for adding correlation results from the correlation calculating unit 163, a register 166 storing the minimum value of the addition result from the adder 165, a comparing memory unit 167 serving as a comparator and storing the address of the minimum value, and an output buffer/output result storage unit 168. A standard data string is input to an input bus 169, and a reference data string to be compared with the standard data string is input to an input bus 170. The memory units 161 and 162 are constituted by SRAMs, which are constituted by general CMOS circuits.

Data input from the reference data memory unit 162 and the standard data memory unit 161 and sent to the correlation calculating unit 163 are subjected to correlation calculation by the correlation calculating circuit of the present invention. The data are therefore processed by high-speed parallel arithmetic operations. For this reason, a high-speed operation can be attained with a small number of elements, and a reduction in chip size is attained, thereby realizing a reduction in cost. The correlation calculation result is subjected to scoring (evaluation) of correlation calculation in the adder 165, and the resultant value is compared with the value of the register unit 166, in which the maximum correlation result (the addition value is the minimum value) before the above correlation calculation is stored, by the comparing memory unit 167. Assume that the current operation result is smaller than the minimum value of the previous calculation results. In this case, the resultant value is newly stored in the register unit 166. If the previous result is smaller, the result is maintained. With this operation, the maximum correlation result is stored in the register unit 166, and all data strings are calculated. Thereafter, the calculation result is output as a 16-bit signal through an output bus 171.

Note that the control unit 164, the adder 165, the register 166, the comparing memory unit 167, and the output buffer/output result storage unit 168 are constituted by general CMOS circuits. By using the circuit arrangement including the reset element in the present invention for the adder 165 and the like, in particular, an accurate operation of the sense amplifier and high-speed processing can be realized. As described above, in addition to an increase in operation speed and a reduction in cost, a reduction in current consumption and hence a reduction in power consumption can be realized because arithmetic operations are executed on the basis of capacitances. This chip is therefore suitable for a portable device such as an 8-mm VTR camera or the like.

[Eleventh Embodiment]

The 11th embodiment of the present invention will be described with reference to FIGS. 18A to 18C. The 11th embodiment is associated with a chip arrangement obtained by a combination of the techniques of the present invention and an optical sensor (solid-state image pickup element) and adapted to perform high-speed image processing before image data is read out.

FIG. 18A is a schematic block diagram showing the overall arrangement of the chip of the present invention. FIG. 18B is a schematic circuit diagram showing the arrangement of a pixel portion of the chip of the present invention. FIG. 18C is a schematic view for explaining the contents of the operation of the chip of the present invention.

Figure 18C:
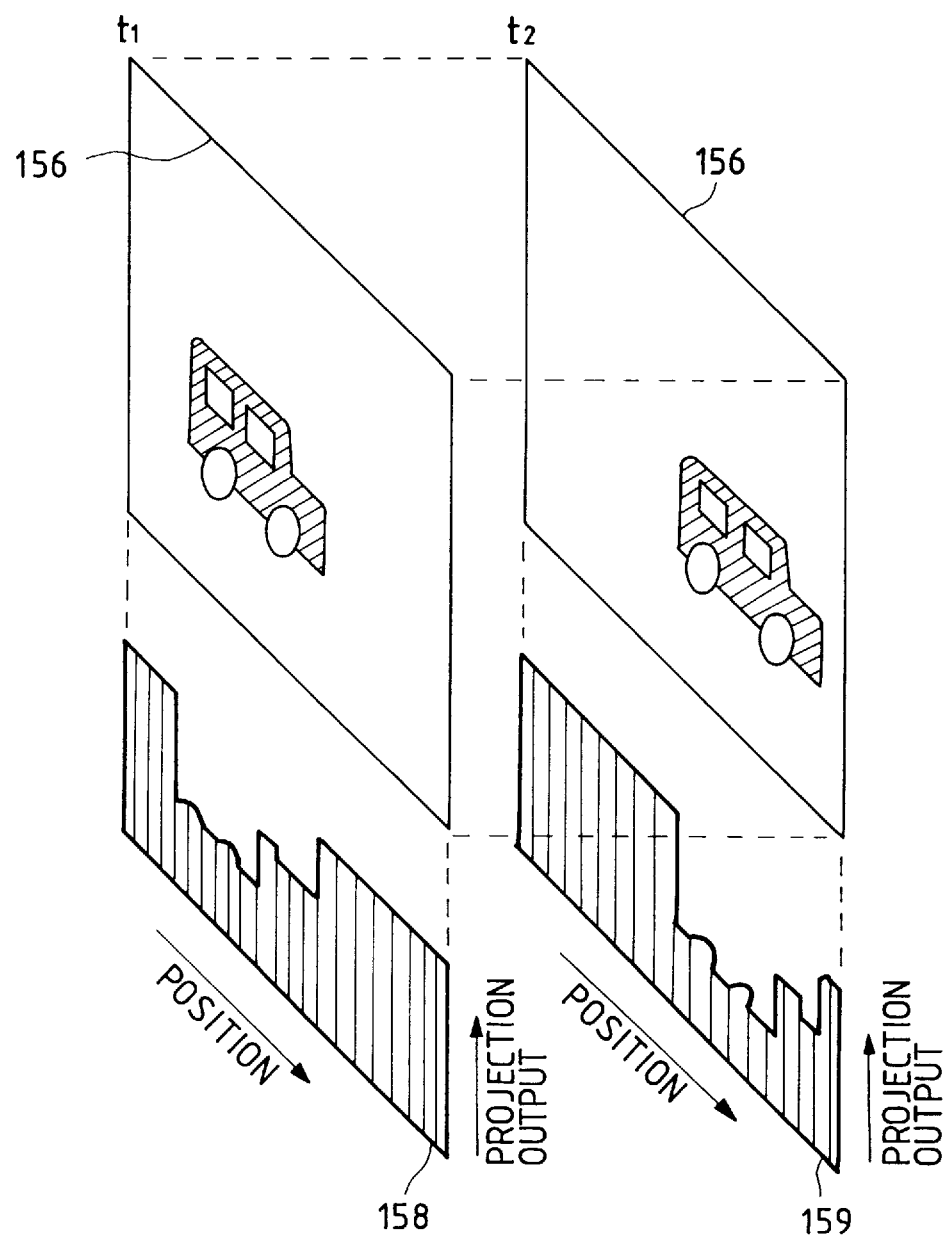
FIG. 18C is a view for explaining the contents of an arithmetic operation.

Referring to FIGS. 18A to 18C, the chip includes light-receiving portions 141, each including a photoelectric conversion element, line memories 143, 145, 147, and 149, correlation calculating units 144 and 148, and an arithmetic output unit 150. Each light-receiving portion 141 shown in FIG. 18B includes coupling capacitor 151 and 152 for connecting light signal output terminals 142 and 146 to output bus lines, a bipolar transistor 153, a capacitor 154 connected to the base region of the bipolar transistor 153, and a switch MOS transistor 155. Image data incident on an image data sensing unit 160 is photoelectrically converted by the base region of the bipolar transistor 153.

An output corresponding to the photoelectrically converted light carrier is read out by the emitter of the bipolar transistor 153 to raise the potentials of the output bus lines 142 and 146 in accordance with an input stored charge signal. With the above operation, the addition result of pixels in the vertical direction is read out by the line memory 147, and the addition result of pixels in the horizontal direction is read out by the line memory 143. If a region in which the base potential of the bipolar transistor 153 is to be raised is selected by a decoder (not shown) through the capacitor 154 of the pixel portion, an addition result in an arbitrary region of the image data sensing unit 160 in the X or Y direction can be output.

Assume that images 156 and 157 are respectively input at time $t_1$ and time $t_2$, as shown in FIG. 18C. In this case, when the outputs are added in the Y direction, the addition results become image signals 158 and 159 indicating the moving states of the vehicle in FIG. 18C. These data are respectively stored in the line memories 147 and 149 in FIG. 18A. In addition, the data in the horizontal direction are respectively stored in the line memories 143 and 145.

As is apparent from the data string outputs 158 and 159 of the image signals in FIG. 18C, the two data are shifted from each other in accordance with the movement of the image. The correlation calculating unit 148 calculates the shift amount. Similarly, when the data in the horizontal direction is calculated by the correlation calculating unit 144, the movement of the object on the two-dimensional plane can be detected by a very simple method.

The correlation calculating circuit of the present invention can be applied to the correlation calculating units 144 and 148. The resultant circuit has a smaller number of elements than a conventional circuit, and the elements can be arranged at the pitch of sensor pixels. This arrangement is designed for an arithmetic operation based on analog signals from the sensor. As is apparent, if the A/D converters of the present invention are arranged between the line memory units and the output bus lines, digital correlation calculation can also be properly performed.

As the sensor elements of the present invention, bipolar elements have been described above. Even if, however, MOS elements are used, effective sensor elements can be obtained by using only photodiodes without any amplification transistors.

In this embodiment, correlation calculation of data strings obtained at different times is performed. If, however, X and Y projection results of a plurality of pattern data to be recognized are stored in one memory unit, pattern recognition can also be realized.

As described above, with a combination of an image input unit and the correlation calculating circuit and the like of the present invention, the following effects can be obtained:

(1) Since parallel arithmetic operations are performed for data read out in parallel altogether instead of processing of data serially read out from a conventional sensor, high-speed motion detection and pattern recognition processing can be realized.

(2) A one-chip semiconductor device including a sensor can be formed, and image processing can be realized without increasing the size of a peripheral circuit. The following high-performance products can be realized with low costs:

(a) a control device for directing a TV screen toward the user;

(b) a control device for directing wind from an air conditioner toward the user;

(c) a tracking control device with an 8-mm VTR camera;

(d) a label recognition device in a factory;

(e) a robot for automatically identifying a person; and (f) an inter-vehicle distance control device.

The combination of the present invention and the image input unit has been described above. As is apparent, however, the present invention is effective for speech recognition processing and the like as well as image data processing.

Figure 19:
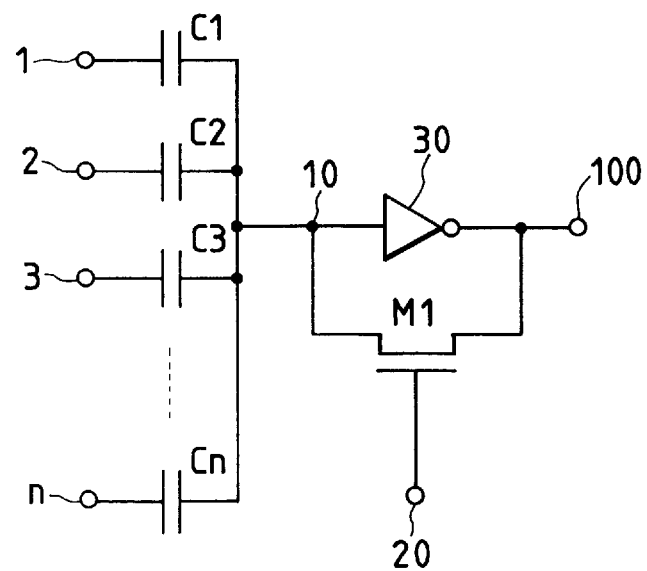
FIG. 19 is a schematic circuit diagram for explaining the circuit arrangement of a semiconductor device.

FIG. 19 shows a simple example of a circuit which has a plurality of input terminals commonly connected through capacitor, and is adapted to compare/determine low voltages by using a semiconductor circuit having an inverter amplifier whose input terminal is connected to the common connection terminal.

Referring to FIG. 19, this circuit includes signal input terminals 1, 2, 3, . . . , n, capacitances C1, C2, C3, . . . , Cn, an input terminal 10 of the inverter amplifier, an output terminal 100 of the inverter amplifier, a switch M1 arranged between the output and input terminals of the inverter amplifier, and a control terminal 20 of the switch M1. In this arrangement, when a potential different VH is applied to the first signal input terminal while the switch M1 is in an OFF state and the input terminal of the inverter amplifier is in a floating state, a voltage amplitude Vfg generated at the input terminal of the inverter amplifier is given by $$Vfg = VH^{*}C1/\{C1+C2+C3+\ldots+Cn\} \quad (11)$$

If, for example, $C1=C2=C3 \ldots =Cn$, Vfg is VH/n. If $C1=(C2)/2=(C3)/4=\ldots(Cn)/2^{(n-1)}$, Vfg is $VH/2^{(n-1)}$. That is, the voltage amplitude Vfg greatly decreases in accordance with the value of n (when n=8 and VH=5 V, 625 mV and 20 mV are respectively obtained).

In order to detect such a small voltage change, for example, the switch Ml is turned on to clamp the input terminal voltage of the inverter amplifier to an intermediate level of the transfer characteristics of the inverter and set the inverter amplifier to the operating point at which the maximum voltage gain is set before an input signal is supplied to each signal input terminal. Thereafter, the switch Ml is turned off, and an input signal is supplied to a certain signal input terminal, as described above. Even if, for example, the voltage amplitude Vfg generated at the input terminal of the inverter amplifier is as low as 10 mV, since the voltage gain of the inverter amplifier is high, the inverter amplifier is inverted by the low voltage. As a result, high-precision voltage change detection and comparison/determination can be realized.

If, however, the circuit is designed such that the inverter amplifier is quickly inverted in response to a voltage change in the positive direction which is applied to each signal input terminal after the inverter amplifier is clamped to the intermediate level, the circuit cannot be directly applied to, e.g., a control operation of inverting the inverter amplifier only when a potential change exceeding an arbitrary potential level occurs after the amplifier is clamped/reset to the intermediate level.

The following embodiment designed to solve this problem, in particular, will be described in detail below.

[Twelfth Embodiment]

Figure 20:
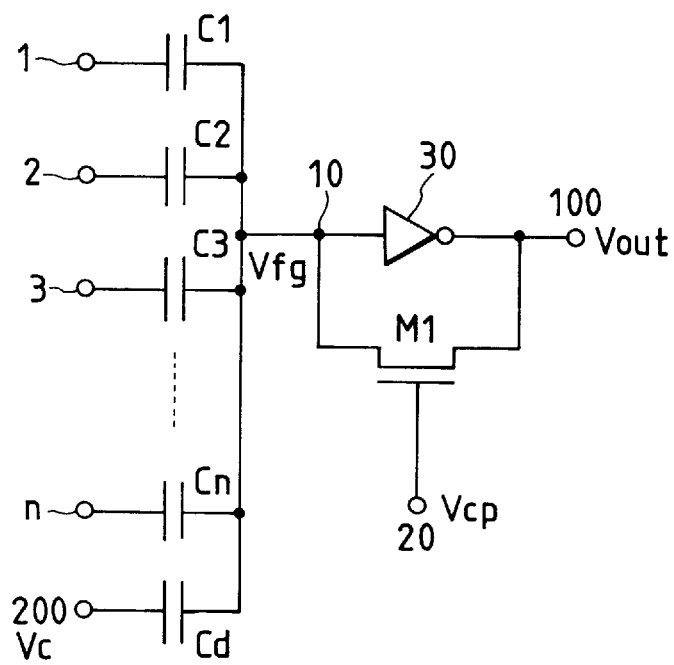

FIG. 20 is a schematic circuit diagram for explaining the 12th embodiment of the present invention. Referring to FIG. 20, this circuit includes signal input terminals 1, 2, 3, ..., n, a control terminal 200 for shifting a potential Vfg of the input terminal of an inverter amplifier to a desired level, capacitances C1, C2, C3, ..., Cn, Cd, an input terminal 10 of the inverter amplifier, an output terminal 100 of the inverter amplifier, a switch Ml arranged between the output and input terminals of the inverter amplifier, and a control terminal 20 of the switch Ml.

FIGS. 21A to 21E are schematic timing charts for explaining the operation of the present invention. The operation will be described in detail below with reference to FIGS. 21A to 21E.

In a clamp/reset interval Tcp, a signal Vcp is set at High level, and the switch M1 is turned on, so that the potential of the input terminal of the inverter amplifier is clamped to an intermediate level Vinv of the transfer characteristics of the inverter. At this time, all the signal input terminals 1, 2, 3, ..., n are set at Low level, and the control terminal 200 is set at High level.

The signal Vcp is set at Low level to turn off the switch Ml and set the input terminal of the inverter amplifier in a floating state. Thereafter, the control terminal 200 is set at Low level. As a result, the potential Vfg of the input terminal of the inverter amplifier which is in the floating state is shifted from the intermediate level Vinv through the capacitance Cd by ΔV.

If the potential difference between Low level and High level is represented by VH, ΔV is given by $$\Delta V = VH^{*}Cd/\{C1+C2+C3+\ldots+Cn+Cd\} \quad (12)$$

If, therefore, the ratios of the capacitances C1, C2, C3, ..., Cn and the capacitance Cd are arbitrarily set, the shift amount from the intermediate level Vinv can be set to an arbitrary value. If, for example, $C1=(C2)/2=(C3)/4=\ldots Cn/2^{(n-1)}$, and Cd=C1/2, ΔV is about 10 mV for n=8 and VH=5 V. As is apparent, therefore, the shift amount from the intermediate level Vinv can be controlled with a fine level.

After the potential Vfg of the input terminal of the inverter amplifier which is in the floating state is level-shifted by the control terminal 200 in the this manner, signal voltages are respectively applied to the signal input terminals 1, 2, 3, ..., n in an active interval Tact. Letting V1, V2, V3, ..., Vn be the signal voltages respectively applied to the signal input terminals 1, 2, 3, ..., n, the potential Vfg generated at the input terminal of the inverter amplifier upon application of the respective signal voltages is given by $$Vfg = Vinv - \Delta V + \{V1C1+V2C2+V3C3+\ldots+VnCn\}/\{C1+C2+C3+\ldots+Cn\} \quad (13)$$

This equation is based on equation (12) and $C1+C2+C3+\ldots Cn >> Cd$. As is apparent from equation (13), although the potential Vfg of the input terminal of the inverter amplifier rises upon application of each signal voltage, the inverter amplifier is not inverted unless the rise amount exceeds the initially set shift value ΔV.

Only when each signal voltage rises and the rise amount exceeds the shift amount ΔV afterward, the inverter amplifier is inverted. As described above, in this embodiment, in performing comparison/determination by detecting low voltages, the inverter amplifier can be inverted only when a potential difference which exceeds an arbitrary potential level from the intermediate level occurs.

In this embodiment, the inverter amplifier is used as the comparison/determination unit. However, the present invention is not limited to this, and any device can be used as long as it has a function equivalent to that of the inverter amplifier. For example, a general differential input type amplifier or the like may be used.

As is apparent, a switch for properly switching a Low level setting operation and a signal voltage input operation is required for each signal input terminal.

In addition, as is apparent, in order to realize the above series of driving operations, this circuit needs to have a control circuit means which is logically designed to generate a switching signal to the switch of each signal input terminal, a control signal to the switch arranged in the inverter amplifier, and a control signal for shifting the input terminal potential of the inverter amplifier at proper timings. As such a control circuit, for example, a circuit using a delay element, a circuit obtained by combining logic elements, or a circuit using a logic element controlled on the basis of clocks can be used.

[Thirteenth Embodiment]

FIG. 22 is a schematic circuit diagram for explaining the 13th embodiment of the present invention. Referring to FIG. 22, this circuit includes signal input terminals 1, 2, 3, ..., n, a control terminal 200 for shifting a potential Vfg of the input terminal of an inverter amplifier to a desired level, capacitances C1, C2, C3, . . . , Cn, Cd, an input terminal 10 of the inverter amplifier, an output terminal 100 of the inverter amplifier, a switch Ml arranged between the output and input terminals of the inverter amplifier, and a control terminal 20 of the switch Ml.

This embodiment is characterized in that an ON/OFF signal or its inverted signal for controlling the switch arranged between the output and input terminals of the inverter amplifier is used as a control signal for shifting the potential Vfg of the input terminal of the inverter amplifier to a desired level. The 13th embodiment need not use a special control signal for shifting the potential Vfg of the input terminal of the inverter amplifier to a desired level, unlike the 12th embodiment. A desired function can therefore be realized with a simpler arrangement.

The timing at which the potential Vfg of the input terminal of the inverter amplifier is shifted to a desired level can be delayed with respect to the timing at which the switch arranged between the output and input terminals of the inverter amplifier is turned off by properly inserting a delay element or the like between the output and input terminals.

The operation of this embodiment is basically the same as that of the 12th embodiment.

[Fourteenth Embodiment]

Figure 23:
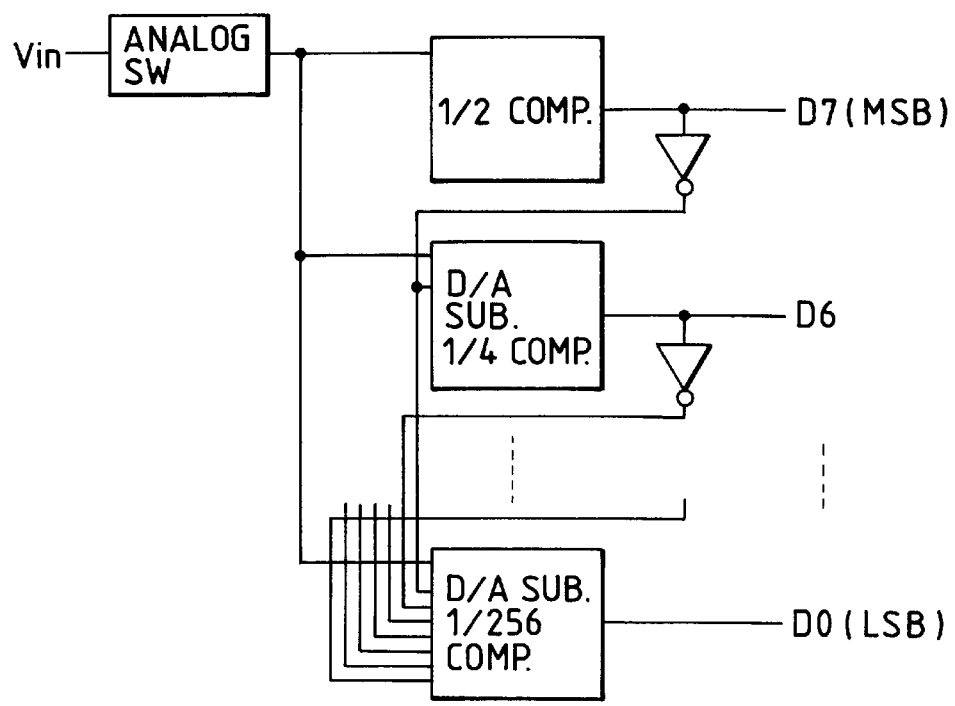

FIG. 23 is a schematic circuit diagram for explaining the 14th embodiment of the present invention. In this embodiment, an eight-bit multi-step type A/D converter is constituted by eight circuits each identical to the circuit of the above embodiment. An analog signal Vin is input to each of the eight circuits through an analog switch. Each circuit corresponds to one bit. At the most significant bit (MSB), ½ level determination is performed. At the lower bits, determination operations at ¼ level, ⅛ level, ¹⁄₁₆ level, . . . are performed. The determination results at upper bits are sequentially fed back as input signals for the lower bits. At lower bits, level determination is performed on the basis of the analog signal Vin and signals from the upper bits.

Prior to a description of the overall operation of the A/D converter of the present invention, the circuit arranged for each bit will be described first.

Figure 24:
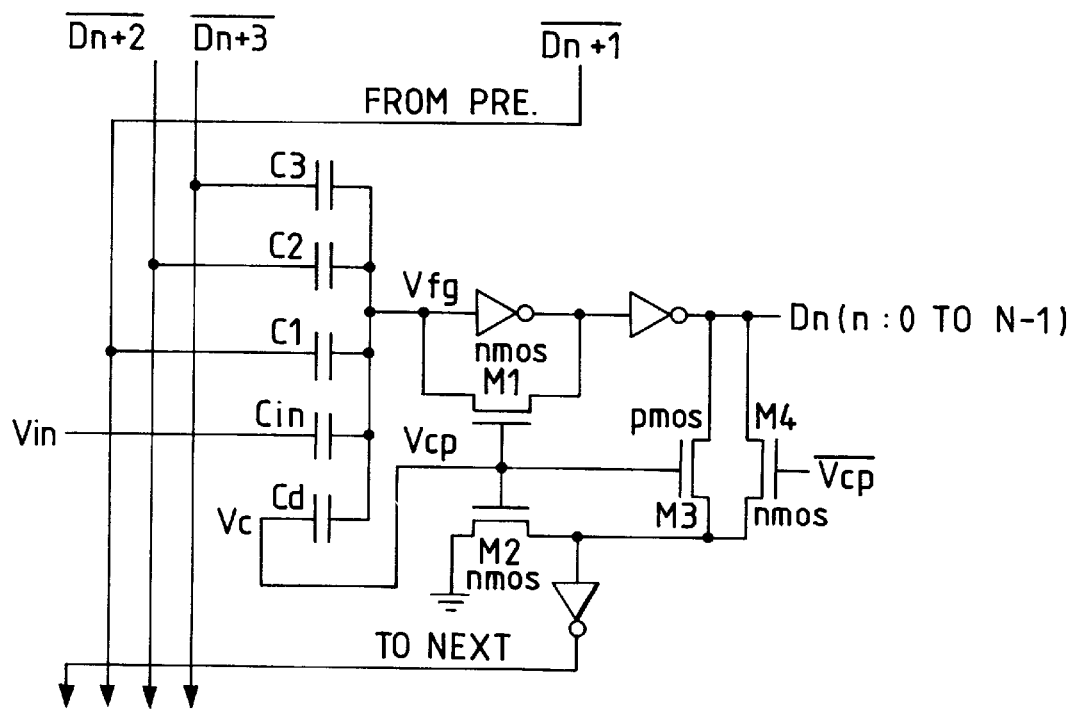

FIG. 24 shows the detailed internal arrangement of the circuit for the fourth bit of the 0th to 7th bits of the eight-bit A/D converter. The analog signal Vin is input to one of a plurality of input terminals, and an inverted signal of an upper output signal Dn+1 is input to each of the remaining input terminals. In addition, a switch M1 is arranged between the output and input terminals of the first inverter amplifier.

As a control signal Vc for shifting a potential Vfg of the input terminal of the first inverter amplifier to a desired level, a signal Vcp for controlling the switch is input. This circuit also includes switches and inverters which are used to transfer signals to lower bits at proper timings. Letting N be the number of bits of the A/D converter, n be the bit number (n=0 to N−1; 0=LSB; N−1=MSB), and j be the capacitance number (j=1 to N−n−1), capacitances (Cin, C1, C2, . . . , Cd) connected to the respective input terminals have the following relationship:

$$Cj=Cin/2^{(N-n-j)}$$

$$Cd=Cin/2^{(N-n)} \tag{14}$$

FIGS. 25A to 25G show the operation timing of the circuit in FIG. 24 and a potential change at each portion. The operation of this circuit will be described with reference to FIGS. 25A to 25G.

In a clamp/reset interval Tcp, the signal Vcp is set at High level, and the switch M1 is turned on, so that the potential of the input terminal of the first inverter amplifier is clamped to an intermediate level Vin of the transfer characteristics of the inverter. At this time, the analog signal input terminal is set at Low level. In addition, each signal input terminal is set at High level through the transfer inverter, and the control terminal Vc is set at High level.

When the signal Vcp is set at Low level to turn on the switch M1 and set the input terminal of the inverter amplifier in a floating state afterward, the potential Vfg of the input terminal of the first inverter amplifier is shifted from the intermediate level Vin by ΔV through a capacitance Cd.

Letting VH be the potential difference between Low level and High level, ΔVn at the nth bit is given by $$\Delta Vn = VH*Cd/\{\Sigma Cj + Cin + Cd\} \tag{15}$$

From equations (14) and (15), ΔV at, e.g., LSB (n=0) is VH/511. If VH=5 V, ΔV is about 10 mV. When n=1, ΔV is VH/255. When n=2, ΔV is VH/127. Other values ΔV can be calculated in the same manner.

After the potential Vfg of the input terminal of the first inverter amplifier which is in the floating state is shifted to the desired level through the control terminal Vc and the capacitance Cd in this manner, the analog signal Vin is input to the analog signal input terminal in the form of a ramp, and the inverted signal of the output signal Dn+1 from the upper bits is input to each signal input terminal of the circuit for each bit through the transfer inverter. At the initial stage, the output signals at all the bits are set at Low level.

At the initial stage at which an analog signal is input, the potential Vfg generated at the input terminal of the first inverter amplifier at, e.g., LSB is given by $$Vfg = Vinv - \Delta V + \{Vincin\}/\{\Sigma Cj + Cin + Cd\} \tag{16}$$

As is apparent from equation (16), at LSB, the potential Vfg of the input terminal of the first inverter amplifier gradually rises after the analog ramp signal voltage is input, and the first inverter amplifier is inverted only when the rise amount exceeds the potential amount ΔV (10 mV) by which the potential Vfg is shifted for the first time, as described above. As a result, the output signal corresponding to LSB changes to High level. When the level of the analog signal Vin further rises, the same as that described with reference to the bit indicated by n=1 occurs. At the bit indicated by n=1, however, the potential rise amount at which the first inverter amplifier is inverted is 20 mV (5 V/255), which is twice the potential rise amount at LSB.

The overall operation of the multi-step type A/D converter of the present invention will be further described on the basis of the above description. After the operations in the clamp/reset interval Tcp are completed, and a potential Vfgn of the input terminal of the first inverter amplifier for each bit is set at a predetermined level as described above, the analog signal Vin is applied such that the potential rises with a predetermined gradient as shown in FIGS. 26A to 26I. As a result, the potential Vfgn of the input terminal of the first inverter amplifier for each bit also rises in the form of a ramp through the capacitance Cin. If the ratio of the change amount of the potential Vfgn to the change amount of the analog signal Vin is represented by a voltage gain Gn, the voltage gain Gn is given by $$Gn = Cin/\{Cin + \Sigma Cj + Cd\} \tag{17}$$

According to equation (17), when all the capacitances of the input terminals of the first inverter amplifiers for the respective bits are set to be the same value, the gains Gn for the respective bits become the same. As shown in FIGS. 26A to 26I, therefore, all the potentials Vfgn of the input terminals of the first inverter amplifiers for the respective bits rise with the same gradient with respect to a change in the analog signal Vin.

When a potential Vfg0 of the first inverter amplifier for the least significant bit (LSB) rises by 10 mV to reach the intermediate level Vinv with respect to a rise in the level of the analog signal Vin, the first inverter amplifier for LSB is inverted. As a result, as shown in FIGS. 26A to 26I, an output terminal D0 for LSB is set at High level.

When the level of the analog signal Vin further rises, a potential Vfg1 of the input terminal of the first inverter amplifier for the next upper bit rises by 10 mV to reach the intermediate level Vinv. At this time, the inverter amplifier is inverted. As a result, as shown in FIGS. 26A to 26I, an output terminal D1 for the first bit is set at High level.

When the output terminal D1 for the first bit is set at High level, the inverted signal is fed back to the lower bit (LSB). At this time, the voltage amount by which the potential Vfg0 of the input terminal of the first inverter amplifier for LSB is caused to fluctuate by a feedback voltage from the nth bit through the capacitance Cn is given by $$dvn = VH^* Cn/(Cin + \Sigma Cj + Cd) \tag{18}$$

According to equations (14) and (18), a voltage amount dv1 by which the potential Vfg0 by a feedback voltage from, e.g., the first bit is VH/255. When VH is 5 V, the voltage amount dv1 is about −20 mV. In this manner, the potential Vfg0 of the input terminal of the first inverter amplifier for LSB is changed to the negative side by the feedback voltage from the first bit. When the potential Vfg0 is returned to the initially set level (Vinv−10 mV) in this manner, the potential Vfg0 of the input terminal of the first inverter amplifier becomes lower than the intermediate level Vinv, as shown in FIGS. 26A to 26I. For this reason, the first inverter amplifier for LSB is inverted again. As a result, the output terminal D0 for LSB is set at Low level. Subsequently, as the analog signal Vin continues to rise, as shown in FIGS. 26A to 26I, the inverter amplifier for the upper bit is inverted, and the resultant inverted signal is fed back to the lower bit. As a result, the output terminals for the respective bits are sequentially set to desired values, and an eight-bit A/D conversion is finally completed.

As described above, when the present invention is applied to an A/D converter, three basic processes required for a multi-step type A/D converter, i.e., D/A conversion, analog subtraction, and comparison, can be effectively (a small number of elements and low power consumption) realized with a single circuit by using a functional circuit, for each bit, in which a plurality of input terminals commonly connected through capacitor, the input terminal of an inverter amplifier is connected to the common connection terminal, and the potential of the input terminal of the inverter amplifier can be accurately set to an arbitrary potential level.

As has been described above, according to the present invention, the reset element is connected to the common connection terminals of the capacitances of the semiconductor device in which the capacitances are respectively connected for multivariable signals to the multiple input terminals, and the common connection terminal of the capacitances is connected to the sense amplifier. With this arrangement, since the reset voltage can be set to a proper value, the reliability of the device can be improved, and the noise component of each signal can be removed. The device can therefore be accurately operated.

In addition, since the circuit for performing parallel arithmetic operations by using the semiconductor device of the present invention can be constituted by transistors smaller in number than those of a general CMOS type logic circuit, the sensitivity with respect to small signals can be improved.

In a signal processing system such as a correlation calculating circuit using the semiconductor device of the present invention, a reduction in circuit size, an increase in operation speed, and a reduction in power consumption can be attained in addition to a reduction in manufacturing cost and an increase in yield.

According to the present invention, there is provided a semiconductor device, having a plurality of input terminals, in which the plurality of input terminals are commonly connected through capacitor, the input terminal of an inverter amplifier is connected to the common connection terminal, and a switch is arranged between the output and input terminals of the inverter amplifier. In this device, after the switch is turned on to set both the input and output terminals of the inverter amplifier to the same potential, the switch is turned off to set the input terminal of the inverter amplifier in a floating state. Thereafter, a voltage is applied to at least one input terminal of the plurality of input terminals to shift the potential of the input terminal of the inverter amplifier, which is in the floating state, to a desired level, and signal voltages are respectively applied to the remaining input terminals. With this driving operation, the function of inverting the inverter amplifier, in executing comparison/determination by detecting low voltages, only when a potential change exceeding an arbitrary potential level occurs at the input terminal of the inverter amplifier can be economically realized with a very small number of elements.

That is, the input voltage amount required for the comparison/determination unit to perform an inverting operation can be easily set to an arbitrary value.

Furthermore, with the use of this function, a multi-step type A/D converter can be economically realized with a very small number of elements.

As is apparent, the present invention is not limited to the above embodiment and the above description, and various changes and modifications can be made within the spirit and scope of the invention. In addition, the above sense amplifier and comparison/determination unit are not limited to the above arrangements, and can be replaced with other arrangements and circuits. Furthermore, for example, as the switch, an element capable of a switching operation, such as a transistor, or a combination of such elements is preferably used. As the comparison/determination unit, inverters and the like may be used.

What is claimed is:

1. A semiconductor device comprising:
   a plurality of input terminals;
   a plurality of capacitors each having one terminal connected to said input terminals through a switch, and each having a second terminal;
   a sense amplifier commonly connected to said second terminals of said capacitors; and
   reset means commonly connected to said second terminals in order to set said second terminals at a predetermined voltage.

2. A device according to claim 1, wherein said sense amplifier comprises an inverter.

3. A device according to claim 2, further comprising a switch for connecting the output and input of said inverter.

4. A device according to claim 3, wherein said latch type positive feedback amplifier has an arrangement in which first and second NMOS transistors have a common source, a gate of said first NMOS transistor is connected to a drain of said second NMOS transistor and a gate of said second NMOS transistor is connected to a drain of said first NMOS transistor, first and second PMOS transistors have a common source, a gate of said first PMOS transistor is connected to a drain of said first PMOS transistor and a gate of said second PMOS transistor is connected to a drain of said first PMOS transistor, a contact between the drain of said first NMOS transistor and the gate of said second NMOS transistor is connected to a contact between the drain of said first PMOS transistor and the gate of said second PMOS transistor to form an input portion of said latch type positive feedback amplifier, and a contact between the drain of said second NMOS transistor and the gate of said first NMOS transistor is connected to a contact between the drain of said second PMOS transistor and the gate of said first PMOS transistor to form an output portion of said latch type positive feedback amplifier, said latch type positive feedback amplifier comprising first switch means between the common source of said first and second NMOS transistors and a lowest potential, and second switch means between the common source of said first and second PMOS transistors and a highest potential.

5. A device according to claim 4, wherein when said latch type positive feedback amplifier is to be changed from an OFF state to an ON state, said first switch means is turned on and said second switch means is turned on with a slight delay with respect to said first switch means after an input signal is transferred to said input terminal.

6. A device according to claim 2, wherein said inverter is a switched inverter.

7. A device according to claim 6, further comprising a second inverter on an output side of said switched inverter.

8. A device according to claim 2, wherein said inverter has an arrangement in which a source and drain of a first NMOS transistor are respectively connected to GND and a drain of a first PMOS transistor, a source of said first PMOS transistor is connected to a highest potential, a gate of said first NMOS transistor is connected to a gate of said first PMOS transistor to form an input of said inverter, and a drain contact between said first NMOS transistor and said first PMOS transistor serves as an output of said inverter.

9. A device according to claim 1, wherein said sense amplifier comprises a latch type positive feedback amplifier.

10. A device according to claim 9, further comprising switch means between the input of said latch type positive feedback amplifier and a common connection portion of said capacitors, and reset means respectively arranged for the input portion and output portion of said positive feedback amplifier and the common connection portion of said capacitors.

11. A device according to claim 10, wherein said differential amplifier has an arrangement in which first and second NMOS transistors constitute a differential pair with a common source, a current source is arranged between the common source and a lowest potential, a gate and drain of said first NMOS transistor are respectively connected to a positive input terminal and a drain and source of a first PMOS transistor, a gate and drain of said second NMOS transistor are respectively connected to a negative input terminal and a drain of a second PMOS transistor, a contact between the gate and drain of said first PMOS transistor is connected to the gate of said second PMOS transistor, and sources of said first and second PMOS transistors are connected to a highest potential point, thereby forming a current mirror type active load, said differential amplifier being capable of transferring a signal to a next stage by using said input terminal, which is the gate of said first NMOS transistor, as a signal input terminal, and by using the contact between the drain of said second NMOS transistor and said second PMOS transistor as an output terminal.

12. A device according to claim 11, wherein said current source can be turned on and off.

13. A device according to claim 11, further comprising an auxiliary capacitance for the gate of said second NMOS transistor, and a switch for connecting the gate and drain of said second NMOS transistor.

14. A device according to claim 9, further comprising a switch for connecting the output and input of said latch type positive feedback amplifier.

15. A correlation calculating device for performing an arithmetic operations, comprising a semiconductor device which comprises:
 a plurality of input terminals;
 a plurality of capacitors each having one terminal connected to said input terminals through a switch, and each having a second terminal;
 a sense amplifier commonly connected to said second terminals of said capacitors; and
 reset means commonly connected to said second terminals in order to set said second terminals at a predetermined voltage.

16. A signal converter serving as an A/D converter including a semiconductor device comprising:
 a plurality of input terminals;
 a plurality of capacitors each having one terminal connected to said input terminals through a switch, and each having a second terminal;
 a sense amplifier commonly connected to said second terminals of said capacitors; and
 reset means commonly connected to said second terminals in order to set said second terminals at a predetermined voltage,
 wherein analog signals are input to multiple input terminals of said semiconductor device, and a digital signal corresponding to the analog signals is output.

17. A signal converter serving as a D/A converter including a semiconductor device comprising:
 a plurality of input terminals;
 a plurality of capacitors each having one terminal connected to said input terminals through a switch, and each having a second terminal;
 a sense amplifier commonly connected to said second terminals of said capacitors; and
 reset means commonly connected to said second terminals in order to set said second terminals at a predetermined voltage,
 wherein digital signals are input to multiple input terminals of said semiconductor device, and an analog signal corresponding to the digital signals is output.

18. A signal processing system including one of a correlation calculating device, a first signal converter, and a second signal converter,
 wherein said correlation calculating device comprises:
  a plurality of input terminals;
  a plurality of capacitors each having one terminal connected to said input terminals through a switch, and each having a second terminal;
  a sense amplifier commonly connected to said second terminals of said capacitors; and
  reset means commonly connected to said second terminals in order to set said second terminals at a predetermined voltage, and wherein said first signal converter comprises:
  a plurality of input terminals;
  a plurality of capacitors each having one terminal connected to said input terminals of said first signal converter through a switch, and each having a second terminal;
  a sense amplifier commonly connected to said second terminals of said capacitors of said first signal converter; and
  reset means commonly connected to said second terminals of said capacitors of said first signal converter in order to set said second terminals at a predetermined voltage,
  wherein analog signals are input to multiple input terminals of said first signal convertor, and a digital signal corresponding to the analog signals is output, and
wherein said second signal converter comprises:
  a plurality of input terminals;
  a plurality of capacitors each having one terminal connected to said input terminals of said second signal converter through a switch, and each having a second terminal;
  a sense amplifier commonly connected to said second terminals of said capacitors of said second signal converter; and
  reset means commonly connected to said second terminals of said capacitors of said second signal converter in order to set said second terminals at a predetermined voltage,
  wherein digital signals are input to multiple input terminals of said second signal convertor, and an analog signal corresponding to the digital signals is output.

19. A device according to claim 1, further comprising second reset means different from said first-recited reset means, wherein said second reset means comprises a reset element arranged at said one terminal of said capacitors.

20. A device according to claim 1, wherein said sense amplifier comprises a differential amplifier.

21. A device according to claim 1, wherein when a minimum capacitance of said capacitors corresponding to said multiple input terminals is represented by C, a total capacitance value of said commonly connected capacitors is approximately an odd multiple of the minimum capacitance C.

22. A signal processing system including a semiconductor device and an image input device for inputting an image signal, said semiconductor device comprising:
  a plurality of input terminals;
  a plurality of capacitors each having one terminal connected to said input terminals through a switch, and each having a second terminal;
  a sense amplifier commonly connected to said second terminals of said capacitors; and
  reset means commonly connected to said second terminals in order to set said second terminals at a predetermined voltage.

23. A signal processing system including a semiconductor device and a memory for storing information, said semiconductor device comprising:
  a plurality of input terminals;
  a plurality of capacitors each having one terminal connected to said input terminals through a switch, and each having a second terminal;
  a sense amplifier commonly connected to said second terminals of said capacitors; and
  reset means commonly connected to said second terminals in order to set said second terminals at a predetermined voltage.

24. A semiconductor device comprising:
  a plurality of input terminals;
  a plurality of capacitor means each having a terminal connected to said input terminals, and each having a second terminal;
  comparing and determining means having an input section to which said second terminals of said plurality of capacitor means are commonly connected, at a predetermined reference potential;
  switch means for electrically connecting the input section of said comparing and determining means and an output section from which a result of a determination by said comparing and determining means is output.

25. A device according to claim 24, further comprising means for turning off said switch means to set the input section of said comparing and determining means in a floating state after turning on said switch means to set the input and output sections of said comparing and determining means to the same potential.

26. A device according to claim 25, further comprising means for shifting a potential of the input section of said comparing and determining means, which is in the floating state, from an intermediate level to a desired level by applying a voltage through at least one input terminal of said plurality of input terminals.

27. A device according to claim 26, further comprising means for causing said comparing and determining means to perform an inverting operation by applying voltages through remaining input terminals of said plurality of input terminals.

28. A device according to claim 27, further comprising means for applying a Low-level signal to the input section, in setting the input and output sections of said comparing and determining means to the same potential, after setting the input section of said comparing and determining means in a floating state by applying a High-level signal to at least one input terminal of said plurality of input terminals.

29. A device according to claim 27, further comprising means for applying a signal for turning on/off said switch means or an inverted signal of the signal to at least one input terminal of said plurality of input terminals.

30. A method of driving a semiconductor device which has a plurality of input terminals and in which the plurality of input terminals are commonly connected through capacitance means, a comparison/determination means has an input portion connected to the common connection terminal and has an output portion, and switch means is arranged between the output portion and the input portion of the comparison/determination means, comprising the steps of:
  turning on the switch means to set the input portion of the comparison/determination means and the output portion of the comparison/determination means to the same potential;
  turning off the switch means to set the input portion of the comparison/determination means in a floating state;
  applying a voltage through at least one input terminal of the plurality of input terminals;
  shifting a potential of the input portion of the comparison/determination means, which is set in the floating state, from an intermediate level to a desired level; and
  applying voltages through remaining input terminals of the plurality of input terminals to cause the comparison/determination means to perform an inverting operation.

31. A method according to claim 30, wherein a Low-level signal is applied to the input portion, in setting the input and output portions of the comparison/determination means to the same potential, after the input portion of the comparison/determination means is set in a floating state by applying a High-level signal to at least one input terminal of the plurality of input terminals.

32. A method according to claim 30, wherein a signal for turning on/off the switch means or an inverted signal of the signal is applied to at least one input terminal of the plurality of input terminals.

33. A method according to claim 30, wherein the shift amount is arbitrarily controlled by arbitrarily setting ratios of magnitudes of the respective capacitance means.

34. A semiconductor circuit comprising a plurality of semiconductor devices, each said semiconductor device comprising:

a plurality of input terminals;

a plurality of capacitors each having one terminal connected to said input terminals through a switch, and each having a second terminal;

a sense amplifier commonly connected to said second terminals of said capacitors; and reset means commonly connected to said second terminals in order to set said second terminals at a predetermined voltage, wherein an output from a first semiconductor device of said plurality of semiconductor devices and/or an inverted output from said first semiconductor device is input to a second semiconductor device of said plurality of semiconductor devices.

* * * * *